(12) United States Patent
Mackler

(10) Patent No.: US 9,202,396 B2
(45) Date of Patent: Dec. 1, 2015

(54) SOLAR POWER GENERATION ASSEMBLY AND METHOD FOR PROVIDING SAME

(75) Inventor: Laurence Mackler, New York, NY (US)

(73) Assignee: Solaire Generation, Inc., New York, NY (US)

( * ) Notice: Subject to any disclaimer, the term of this patent is extended or adjusted under 35 U.S.C. 154(b) by 393 days.

(21) Appl. No.: 12/497,461

(22) Filed: Jul. 2, 2009

(65) Prior Publication Data

US 2010/0000596 A1    Jan. 7, 2010

Related U.S. Application Data

(60) Provisional application No. 61/077,851, filed on Jul. 2, 2008.

(51) Int. Cl.
*H02S 20/10* (2014.01)
*H02S 40/10* (2014.01)
(Continued)

(52) U.S. Cl.
CPC ............... *G09F 11/025* (2013.01); *F24J 2/523* (2013.01); *G09F 17/00* (2013.01); *G09F 19/14* (2013.01);
(Continued)

(58) Field of Classification Search
CPC ... H01L 31/00; H01L 31/042; H01L 31/0422; H01L 31/0424; H01L 31/048; H01L 31/02024; H01L 31/04; H01L 31/052; H01L 31/053; H02S 20/00; H02S 20/10; H02S 30/10; H02S 40/00; H02S 40/10; H02S 40/12
USPC ......... 136/243–251, 291, 230, 223, 205, 206; 250/200, 200.1, 206–206.2, 239; 126/569–582, 593–596, 600–603, 126/621–623, 627; 135/87–161
See application file for complete search history.

(56) References Cited

U.S. PATENT DOCUMENTS

| 4,132,074 A | 1/1979 | Wendel |
| 4,149,523 A | 4/1979 | Boy-Marcotte et al. |

(Continued)

FOREIGN PATENT DOCUMENTS

WO          9736132 A1    10/1997

OTHER PUBLICATIONS

Oxford Dictionary definition of "azimuth" retrieved from http://oxforddictionaries.com/us/definition/american_english/azimuth on Aug. 12, 2013.*

(Continued)

*Primary Examiner* — Christina Chern
(74) *Attorney, Agent, or Firm* — Byrne Poh LLP

(57) ABSTRACT

The present invention relates to a solar power generation assembly and method for providing same involving an array of solar generating modules on a dual-incline structure, which can achieve high energy yields over a wide range of azimuths/orientations. The assembly consists of canopy wings providing for the dual-incline structure, where, depending on specifications, the canopy wings can differ in length, width, angle of inclination, structural material and solar module or other material mounted on the surface. The canopy wings may be pivoted or hinged to enhance the energy generation and/or other functional benefits of the assembly or system, including display elements, advertising, rainwater/precipitation and snow drainage and collection and energy transmission. The assembly or system is modular and may be assembled in a long continuous configuration in which the inclination, width and tilt of the canopy wings may vary of a long distance to maintain substantially consistent energy yields as the assembly or system orientation changes.

19 Claims, 18 Drawing Sheets

(51) Int. Cl.
  *G09F 11/02* (2006.01)
  *G09F 17/00* (2006.01)
  *G09F 19/14* (2006.01)
  *G09F 19/22* (2006.01)
  *G09F 27/00* (2006.01)
  *F24J 2/52* (2006.01)

(52) U.S. Cl.
  CPC .............. *G09F 19/22* (2013.01); *G09F 27/007* (2013.01); *H02S 20/10* (2014.12); *Y02E 10/47* (2013.01); *Y10S 362/812* (2013.01); *Y10T 29/49826* (2015.01)

(56) References Cited

U.S. PATENT DOCUMENTS

| | | | |
|---|---|---|---|
| 4,245,895 A | | 1/1981 | Wildenrotter |
| 4,281,369 A | | 7/1981 | Batte |
| 4,319,310 A | | 3/1982 | Kingsley |
| 4,384,317 A | | 5/1983 | Stackpole |
| 4,429,178 A | | 1/1984 | Prideaux et al. |
| 4,432,341 A | | 2/1984 | Howe et al. |
| 4,453,327 A | | 6/1984 | Clarke |
| 4,484,104 A | | 11/1984 | O'Brien |
| 4,611,090 A | | 9/1986 | Catella et al. |
| 4,636,577 A | | 1/1987 | Peterpaul |
| 4,649,899 A | | 3/1987 | Moore |
| 4,668,120 A | | 5/1987 | Roberts |
| 4,742,291 A | | 5/1988 | Bobier et al. |
| 4,832,001 A | | 5/1989 | Baer |
| 4,835,918 A | | 6/1989 | Dippel |
| 4,841,278 A | | 6/1989 | Tezuka et al. |
| 4,867,133 A | | 9/1989 | Sadler |
| 4,966,631 A | | 10/1990 | Matlin et al. |
| 4,989,124 A | | 1/1991 | Shappell |
| 5,022,929 A | * | 6/1991 | Gallois-Montbrun ........ 136/246 |
| 5,228,924 A | | 7/1993 | Barker et al. |
| D353,129 S | | 12/1994 | Ricaud et al. |
| 5,612,741 A | | 3/1997 | Loban et al. |
| 5,807,440 A | | 9/1998 | Kubota et al. |
| D408,554 S | | 4/1999 | Dinwoodie |
| 5,900,850 A | | 5/1999 | Bailey et al. |
| 6,046,401 A | | 4/2000 | McCabe |
| 6,049,035 A | | 4/2000 | Tsuri et al. |
| D425,013 S | | 5/2000 | Lai |
| 6,111,189 A | | 8/2000 | Garvison |
| 6,260,319 B1 | | 7/2001 | Colomban |
| 6,263,601 B1 | | 7/2001 | Emert |
| D452,328 S | | 12/2001 | O'Brien |
| D456,085 S | | 4/2002 | O'Brien |
| 6,396,239 B1 | * | 5/2002 | Benn et al. ................. 320/101 |
| 6,436,283 B1 | * | 8/2002 | Duke ..................... 210/172.1 |
| 6,455,767 B1 | | 9/2002 | Muller |
| 6,495,750 B1 | | 12/2002 | Dinwoodie |
| 6,518,493 B1 | | 2/2003 | Murakami et al. |
| 6,572,173 B2 | | 6/2003 | Muller |
| 6,631,591 B1 | | 10/2003 | Durham |
| 6,784,357 B1 | | 8/2004 | Wang |
| D505,113 S | | 5/2005 | Lam |
| 6,930,237 B2 | | 8/2005 | Mattiuzzo |
| D511,576 S | | 11/2005 | Shingleton et al. |
| D535,584 S | | 1/2007 | Garrett |
| 7,227,078 B2 | | 6/2007 | Jongerden et al. |
| 7,237,360 B2 | | 7/2007 | Moncho et al. |
| D564,443 S | | 3/2008 | Moore |
| D565,505 S | | 4/2008 | Shugar et al. |
| D571,716 S | | 6/2008 | Anderson |
| D584,223 S | | 1/2009 | Cooper |
| 7,501,713 B2 | | 3/2009 | Fein et al. |
| 2004/0065025 A1 | | 4/2004 | Durham |
| 2005/0035244 A1 | | 2/2005 | Conger |
| 2005/0045224 A1 | | 3/2005 | Lyden |
| 2005/0109384 A1 | | 5/2005 | Shingleton et al. |
| 2005/0241246 A1 | | 11/2005 | Sinha et al. |
| 2006/0011194 A1 | | 1/2006 | Hensley et al. |
| 2006/0090858 A1 | | 5/2006 | Heidenreich |
| 2006/0101683 A1 | | 5/2006 | Baker |
| 2006/0207192 A1 | | 9/2006 | Durham |
| 2006/0225776 A1 | | 10/2006 | Nemazi et al. |
| 2007/0212935 A1 | | 9/2007 | Lenox |
| 2008/0216418 A1 | | 9/2008 | Durham |
| 2008/0308091 A1 | | 12/2008 | Corio |
| 2009/0038672 A1 | * | 2/2009 | Conger ..................... 136/244 |
| 2009/0050194 A1 | | 2/2009 | Noble et al. |

OTHER PUBLICATIONS

Wikipedia entry for "azimuth" retrieved from http://en.wikipedia.org/wiki/Azimuth on Aug. 9, 2013.*
Dictionary.com definition of "azimuth" retrieved from http://dictionary.reference.com/browse/azimuth on Aug. 9, 2013.*
Merriam-Webster definition of "azimuth" retrieved from http://www.merriam-webster.com/dictionary/azimuth on Aug. 12, 2013.*
Heavens Above definition of "azimuth" retrieved from http://www.heavens-above.com/glossary.aspx?term=azimuth on Aug. 9, 2013.*
Notification of Transmittal of the International Search Report and The Written Opinion of The International Searching Authority, or The Declaration, International Search Report and Written Opinion of The International Searching Authority, for related International Application No. PCT/US2009/049625.
Notification of Transmittal of The International Search Report and The Written Opinion of The International Searching Authority, of The Declaration, International Search Report and Written Opinion of The International Searching Authority, for related International Application No. PCT/US2009/049595.
International Preliminary Report on Patentability in International Patent Application No. PCT/US20091049625, filed Jul. 2, 2009, mailed Jan. 13, 2011.
International Search Report in International Patent Application No. PCT/US2009/049625, tiled Jul. 2, 2009, mailed Oct. 26, 2009.
Written Opinion in International Patent Application No. PCT/US2009/049625, filed Jul. 2, 2009, mailed Oct. 26, 2009.

* cited by examiner

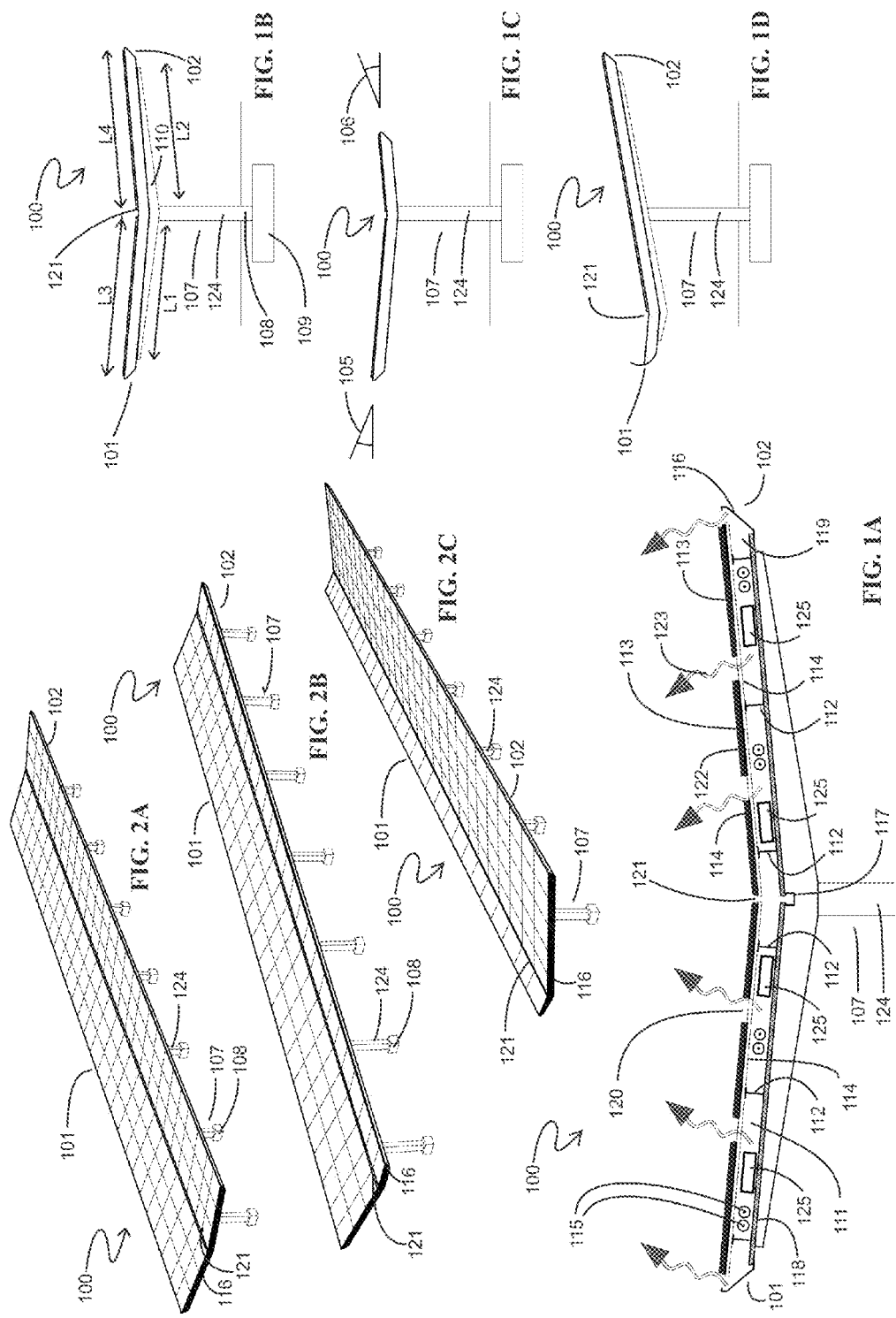

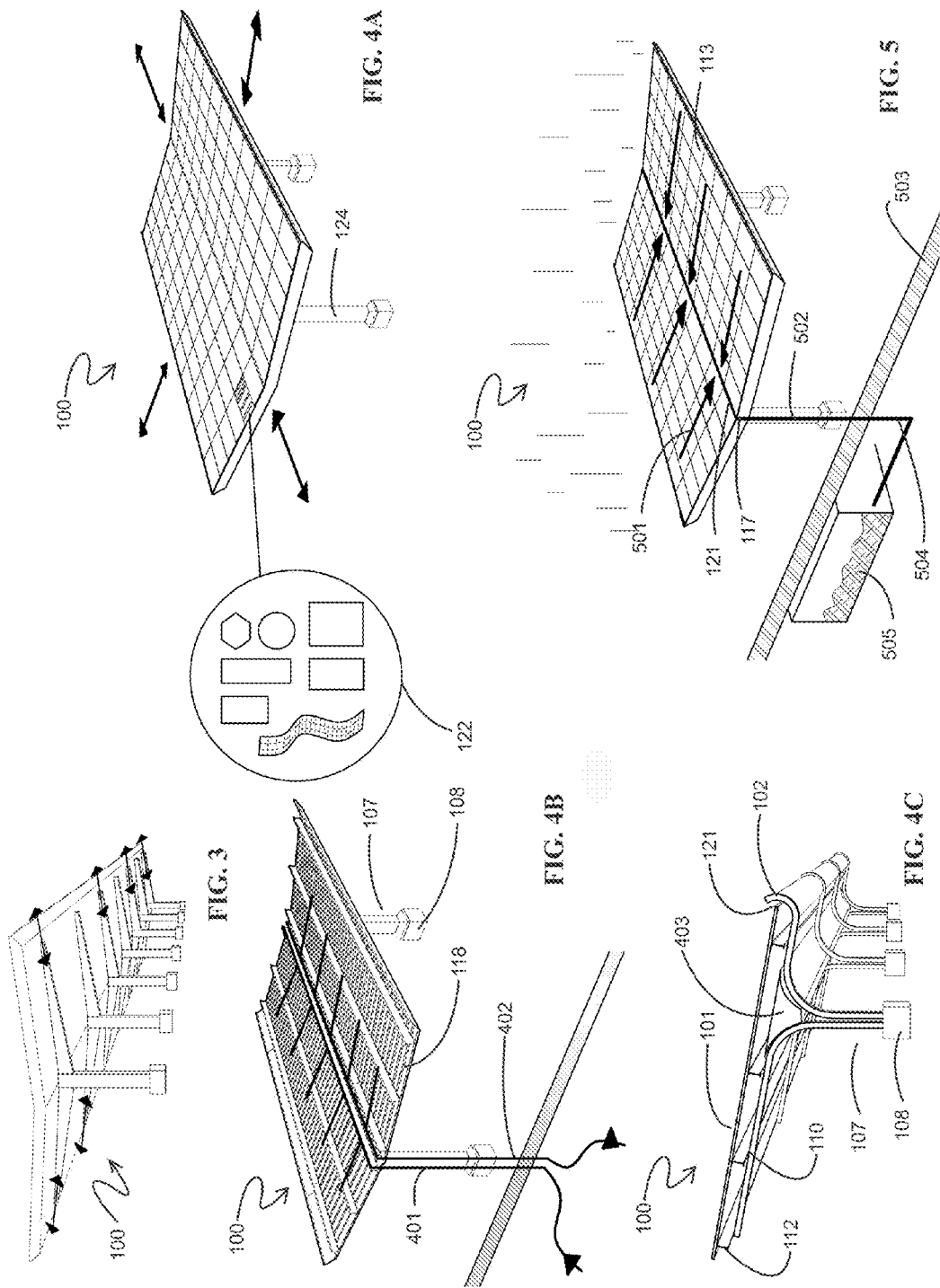

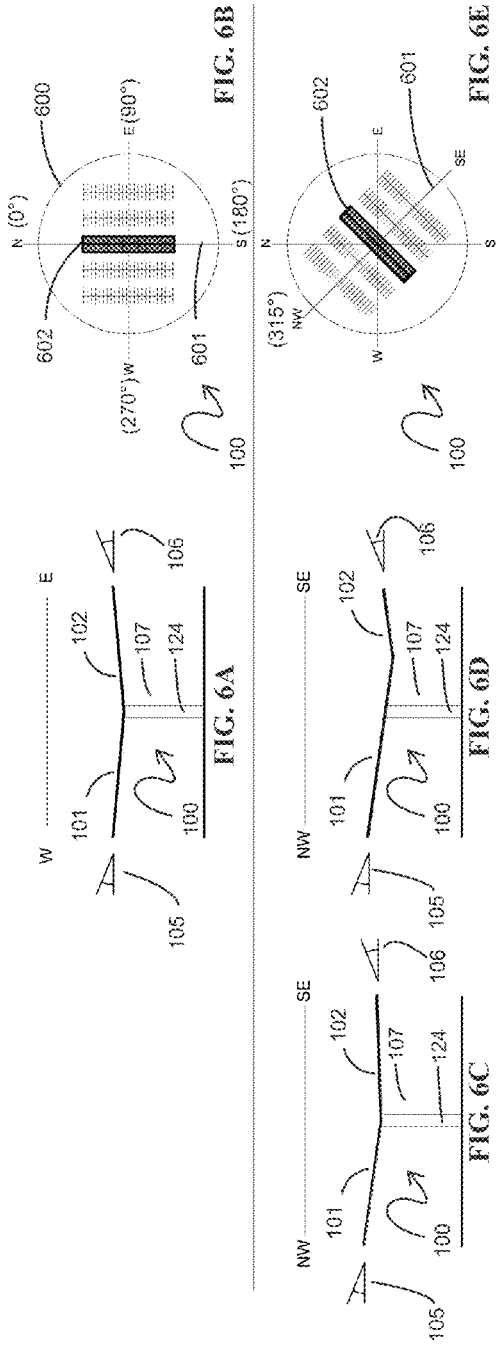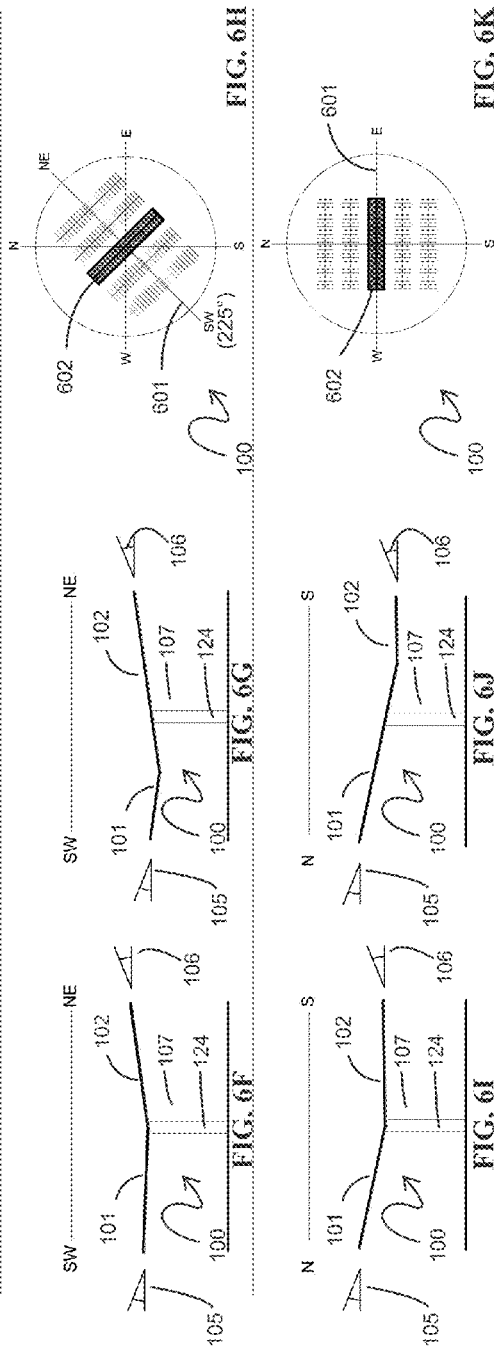

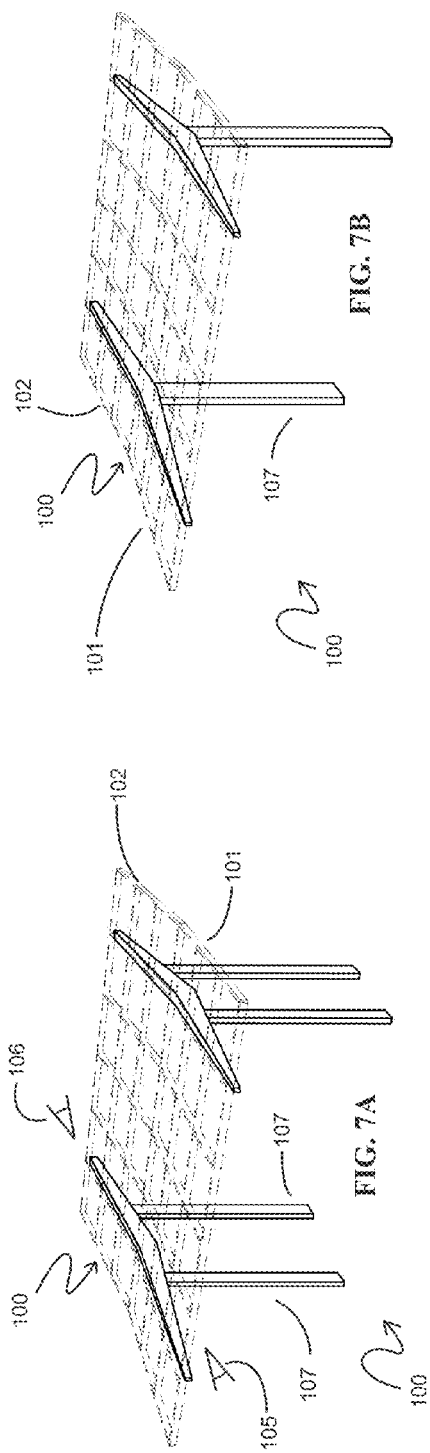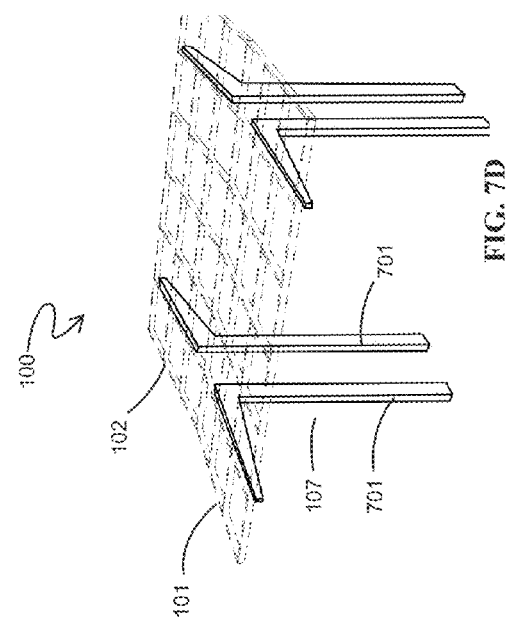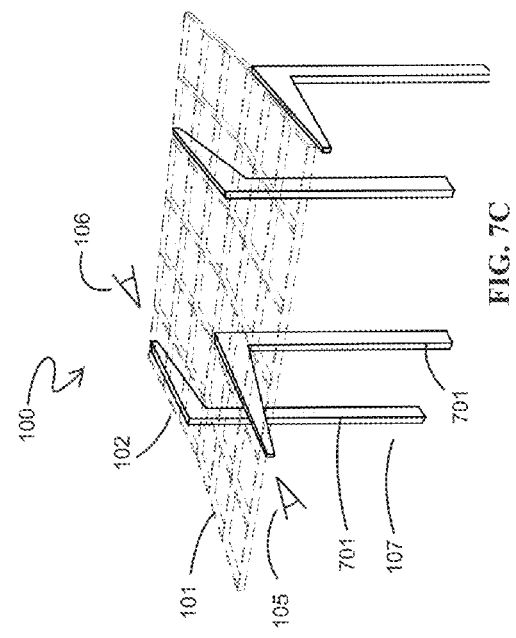

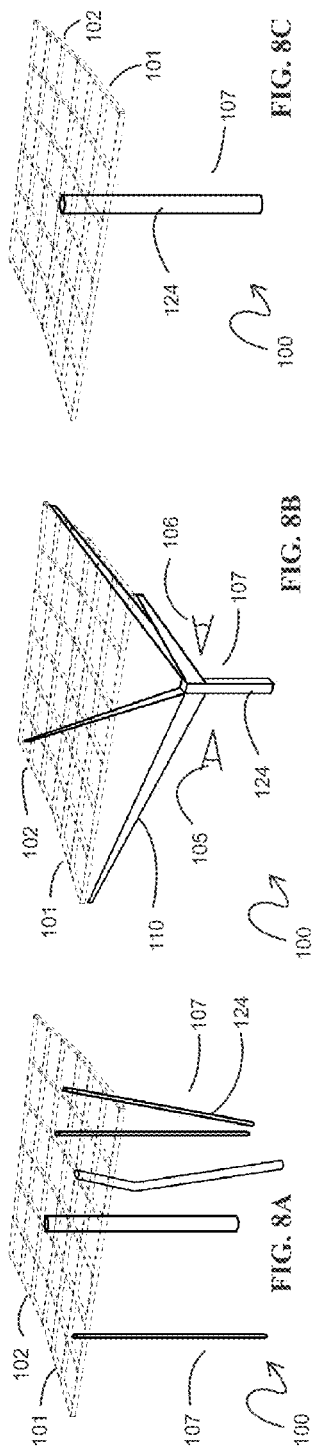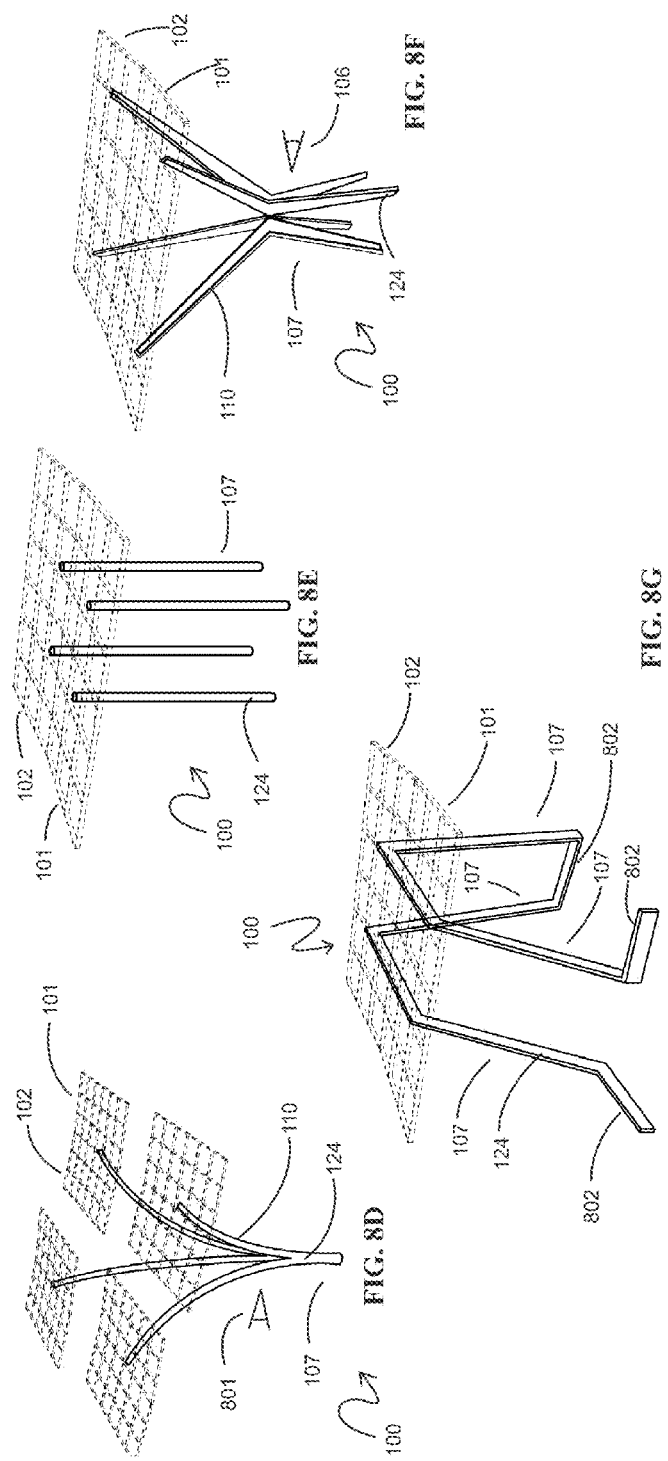

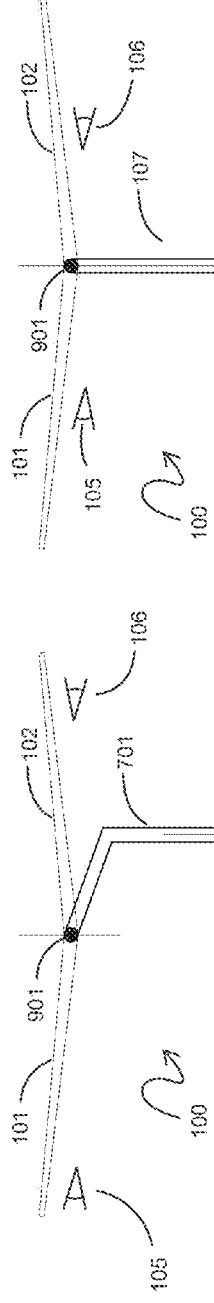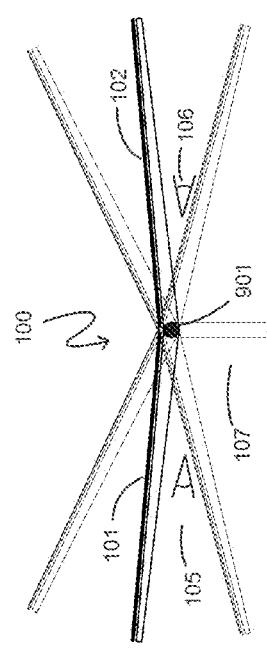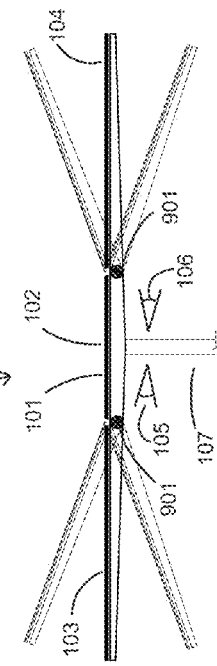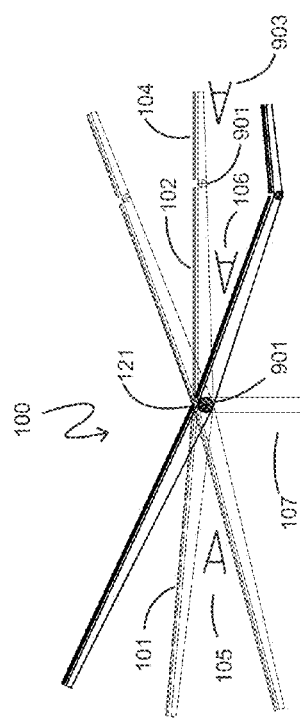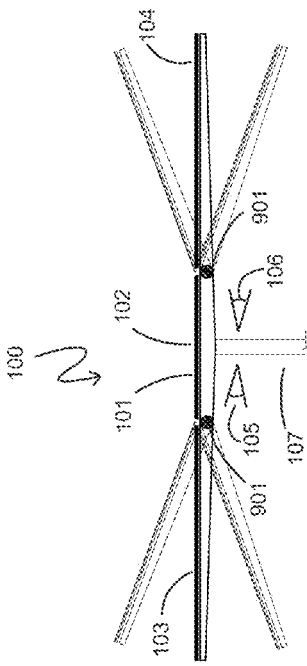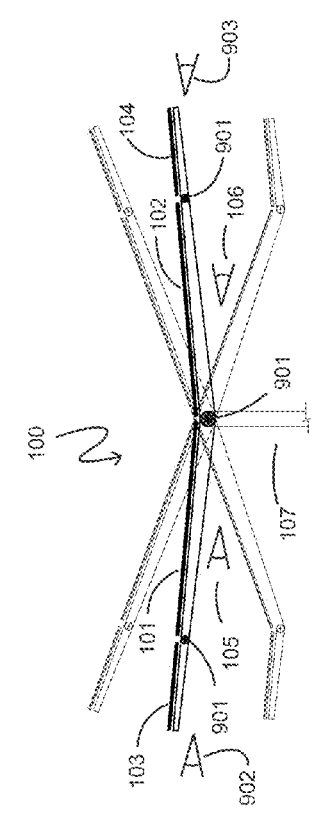

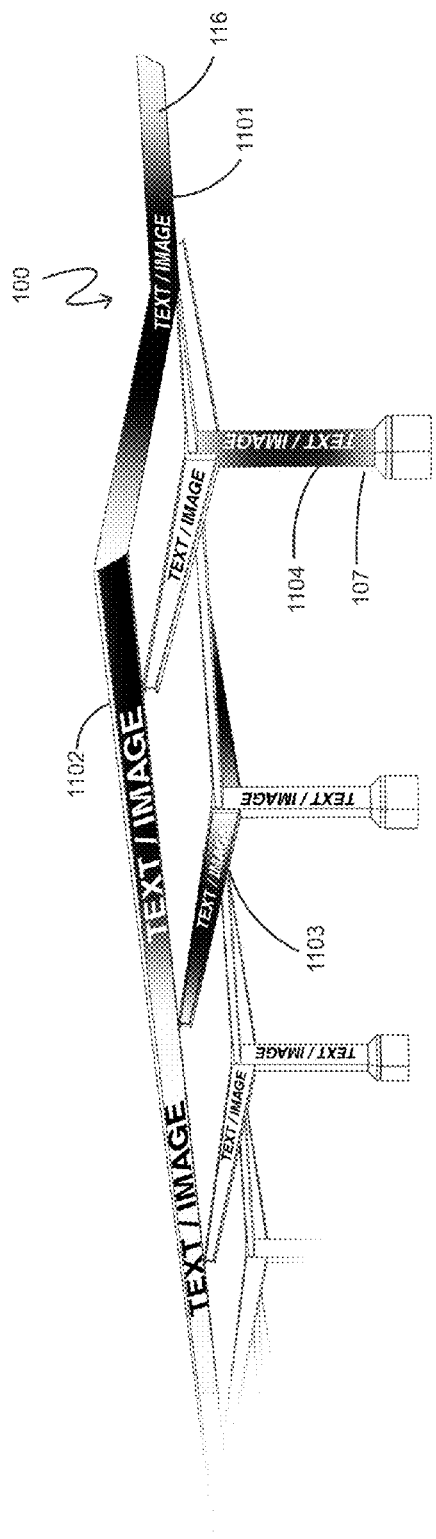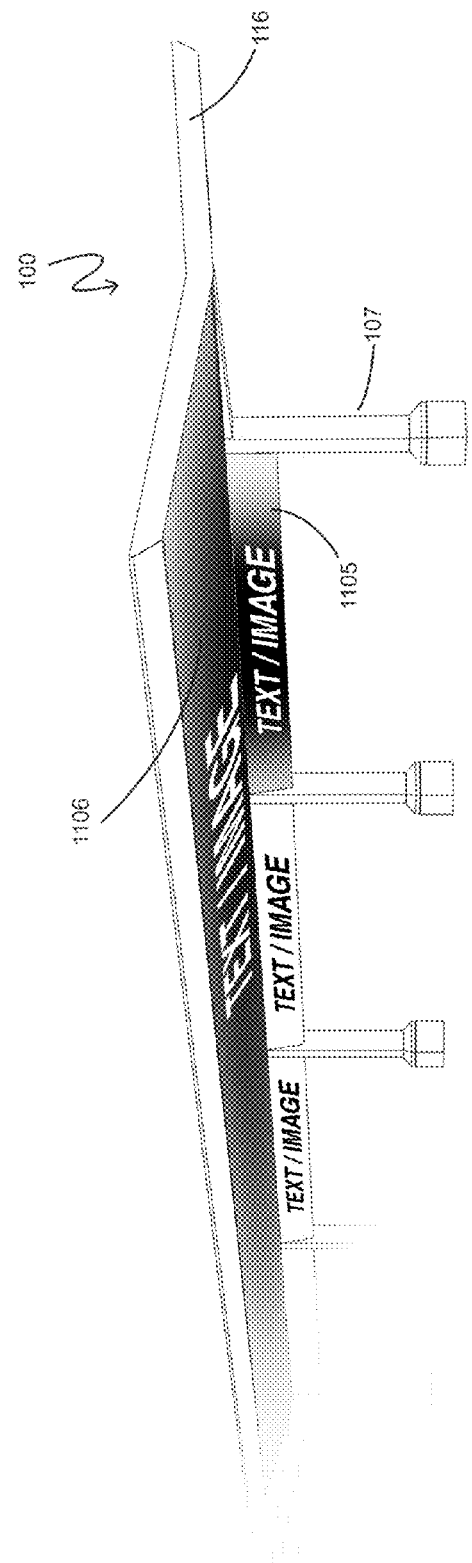

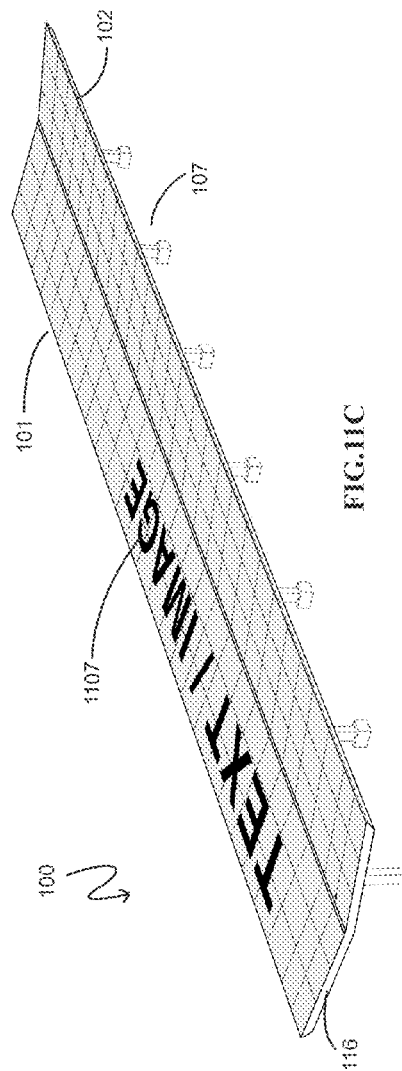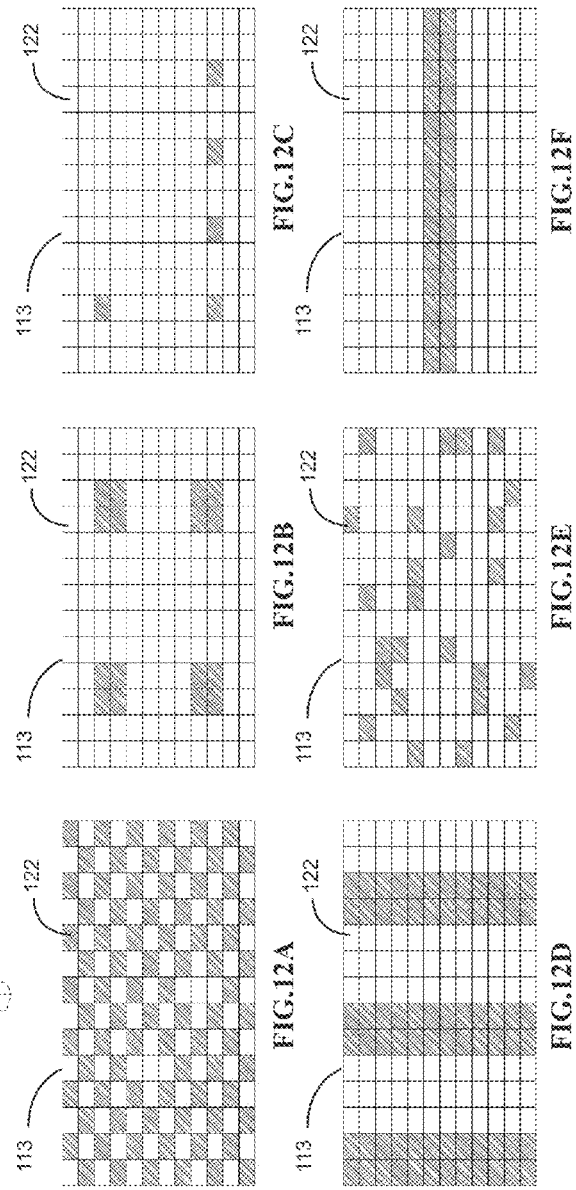

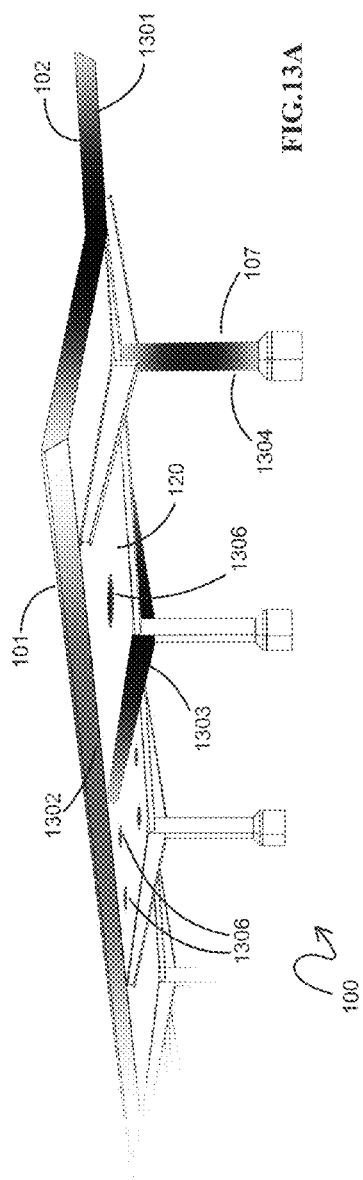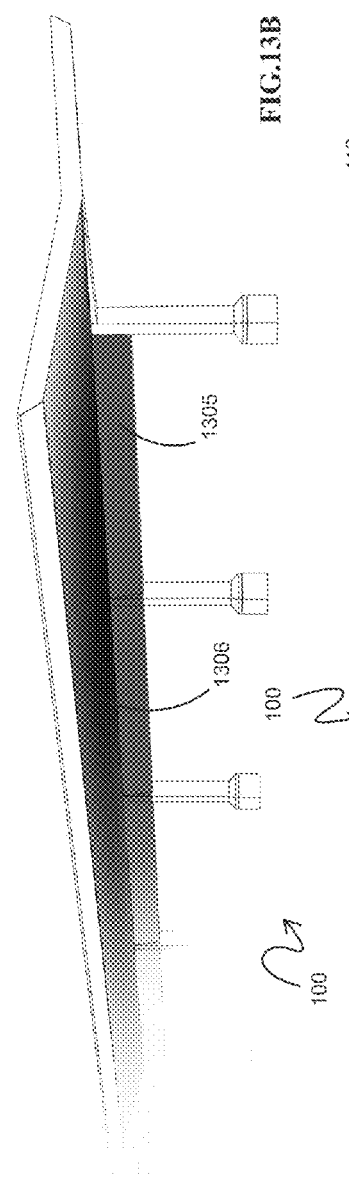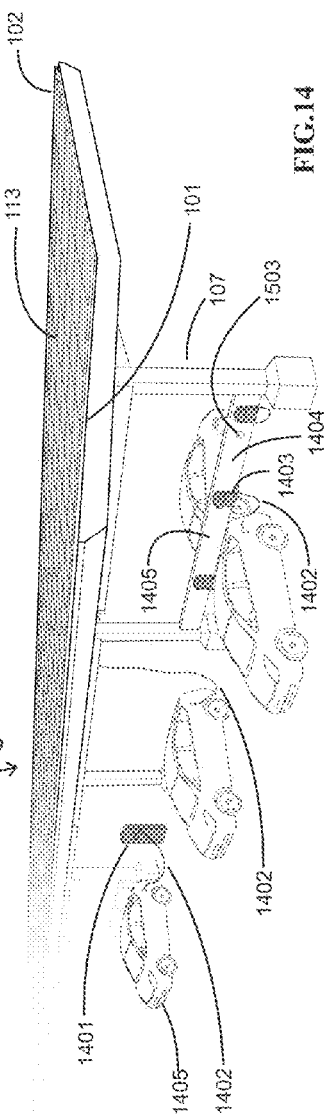

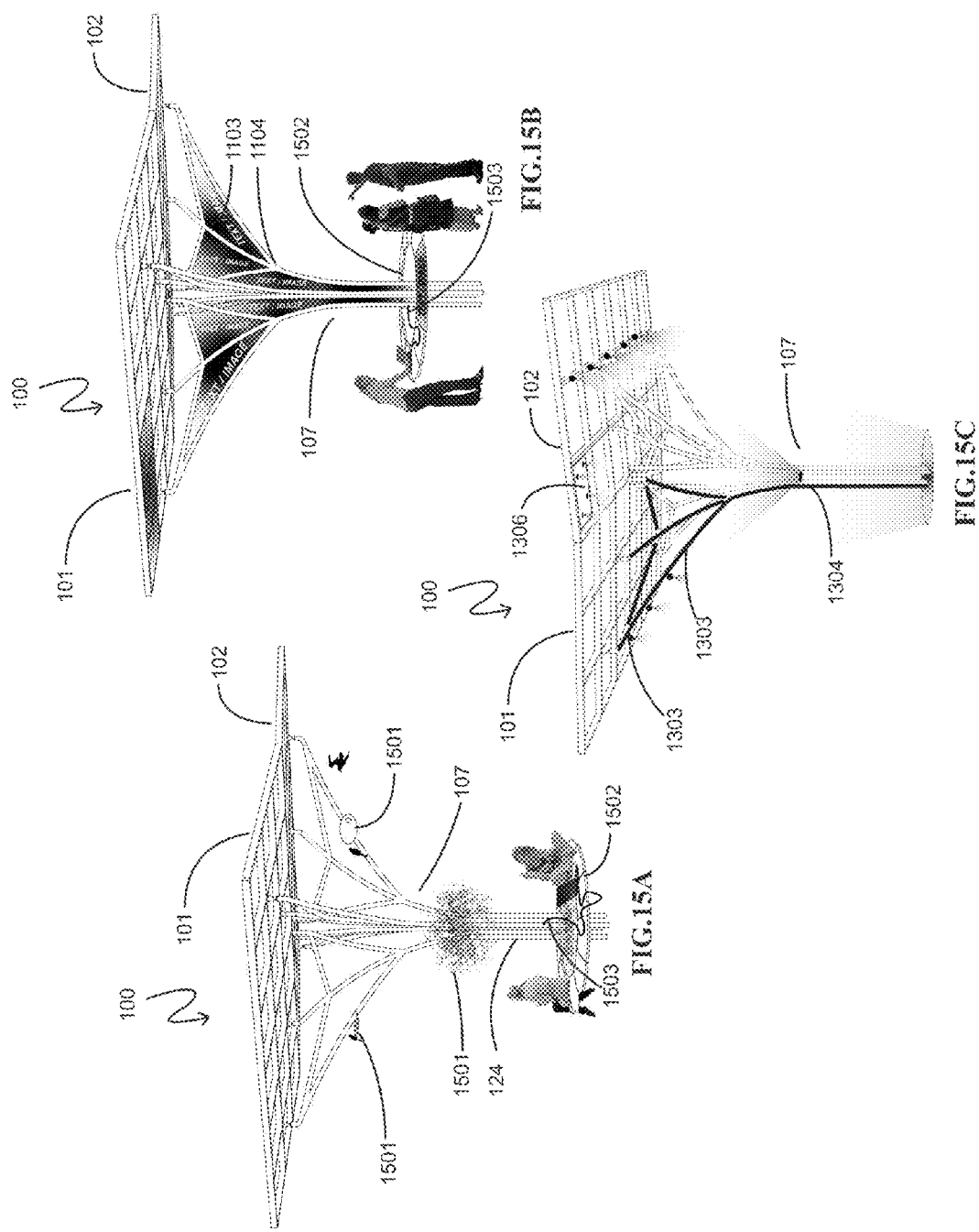

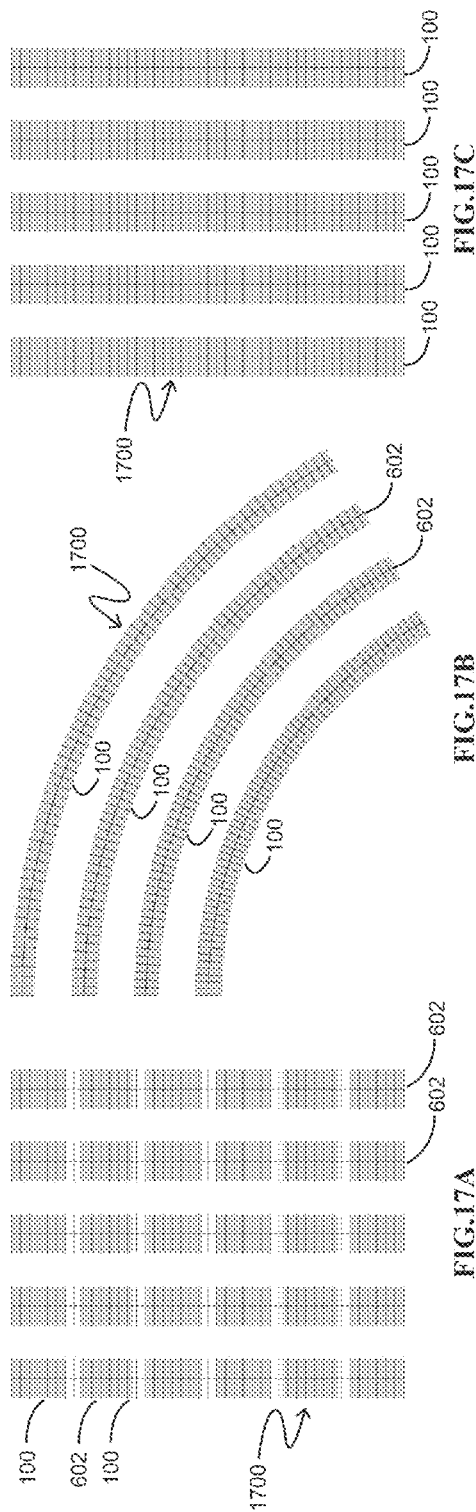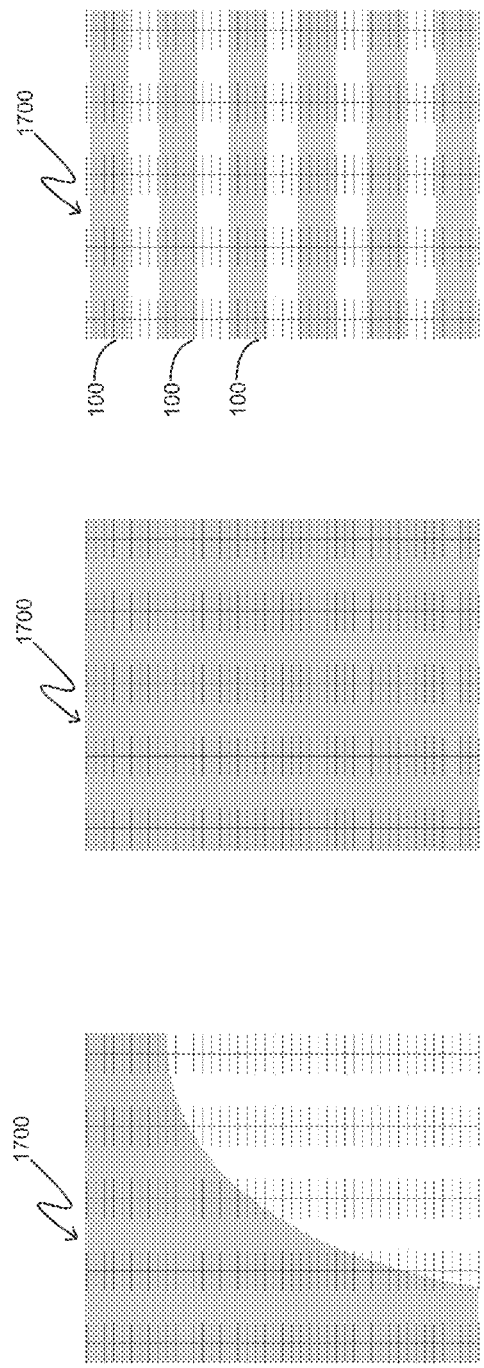

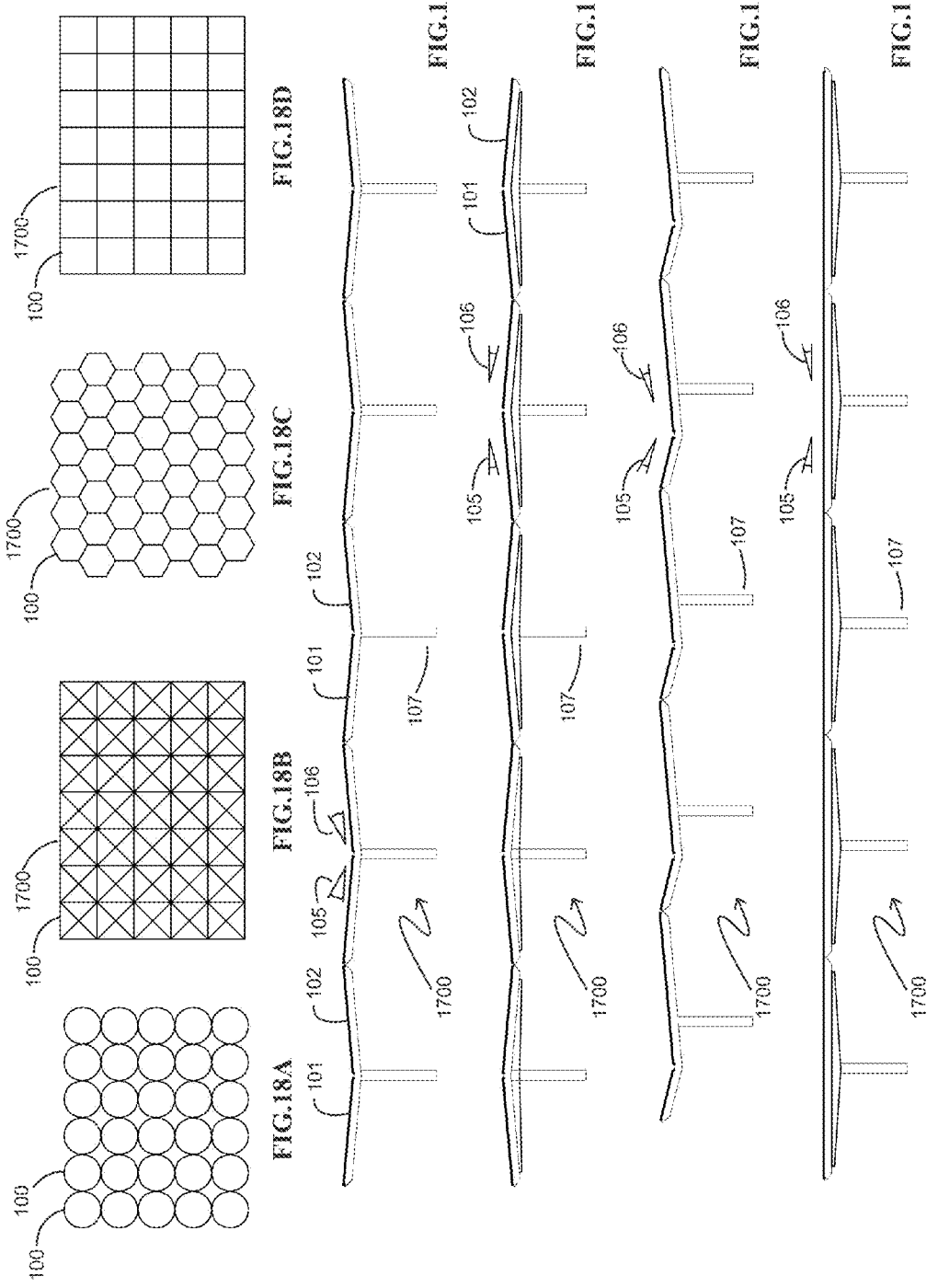

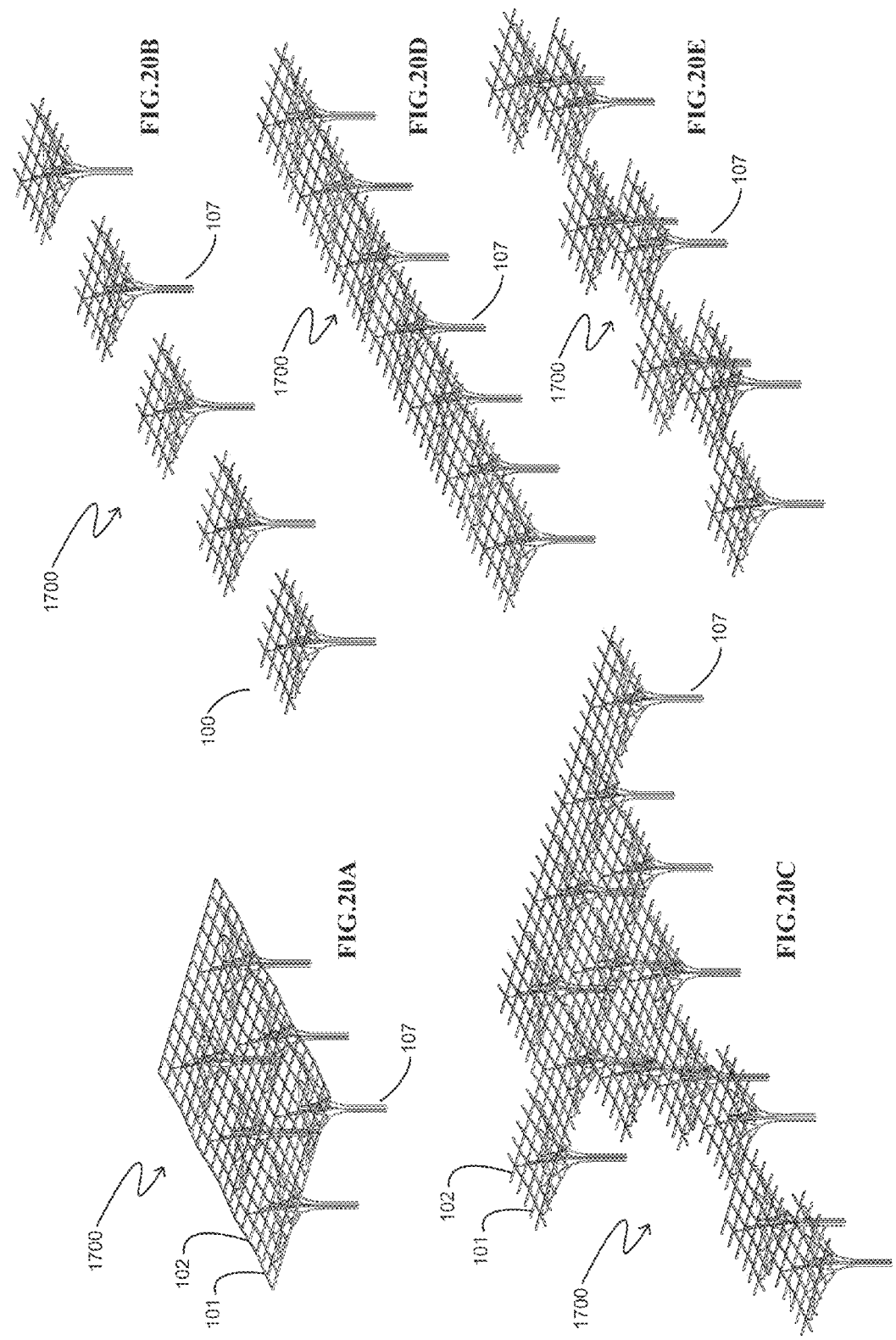

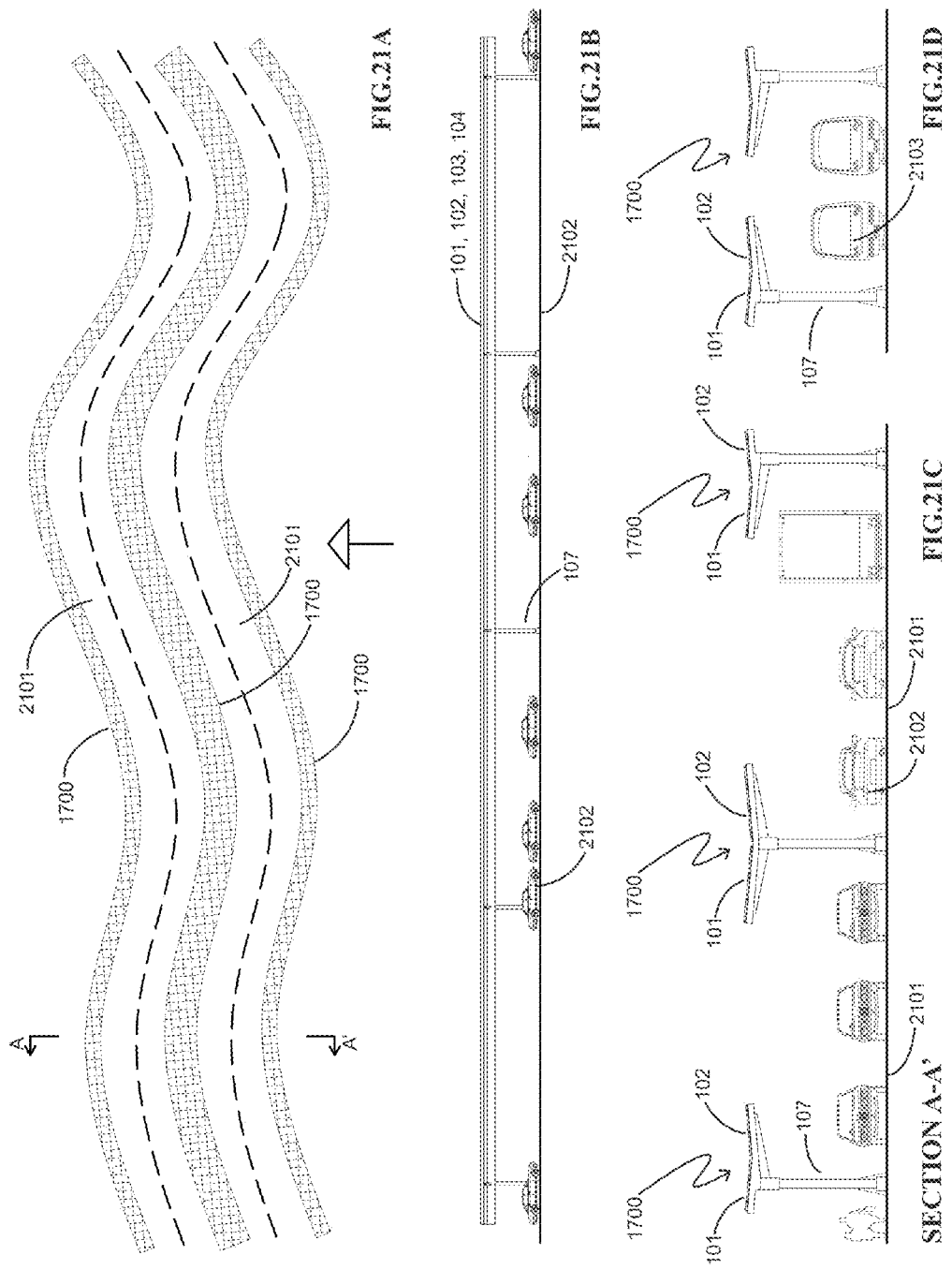

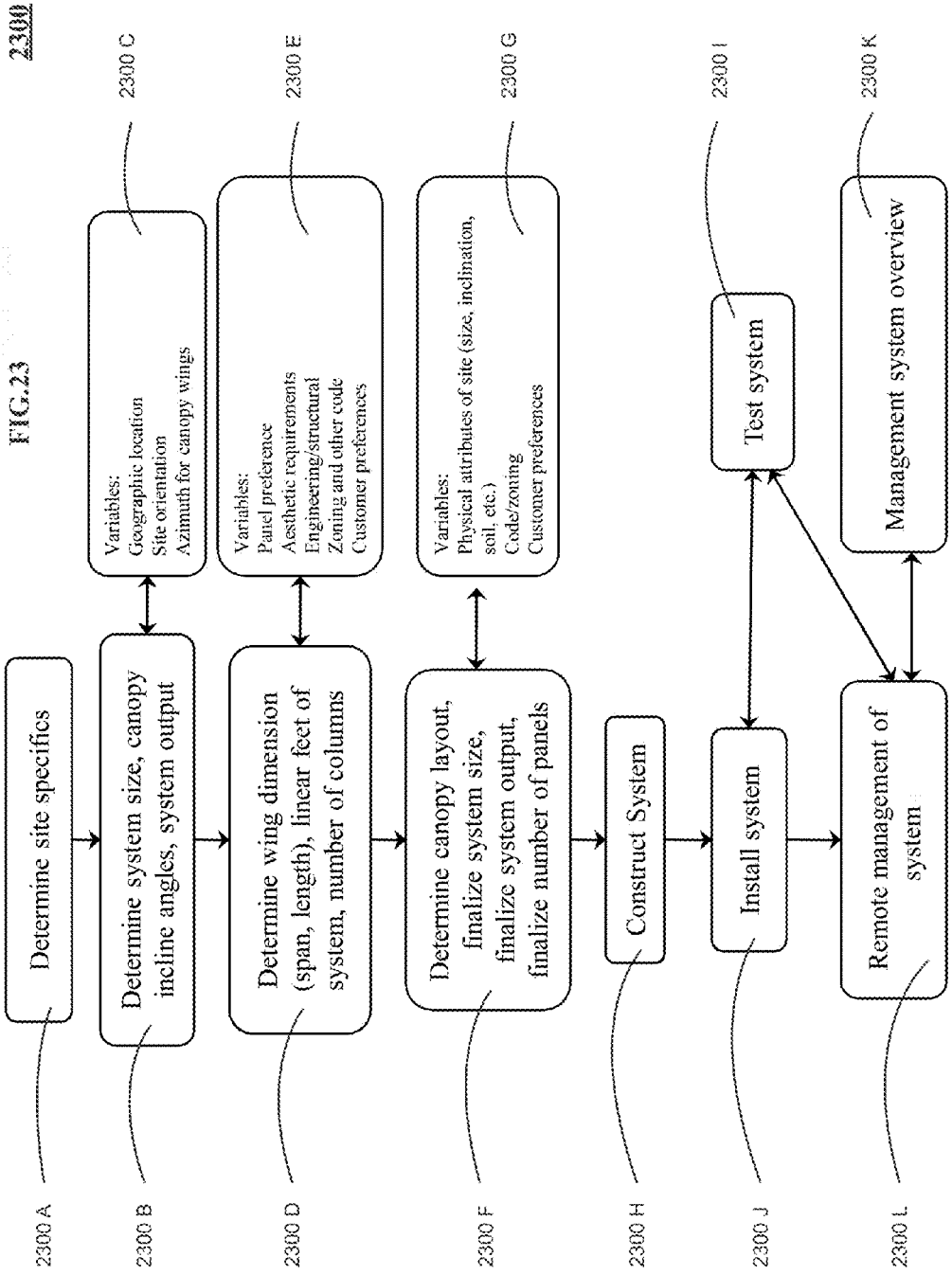

SOLAR POWER GENERATION ASSEMBLY AND METHOD FOR PROVIDING SAME

RELATED APPLICATIONS

This application claims priority to U.S. Provisional Application Ser. No. 61/077,851, filed Jul. 2, 2008, entitled "ADVERTISING AND PROMOTIONAL SYSTEM INVOLVING SOLAR ARRAYS AND VISUAL INDICIA AND METHODS FOR MANUFACTURING THE SAME," which is incorporated herein by reference. This application is also related to PCT Application No. PCT/US2009/049625, entitled "SOLAR POWER GENERATION ASSEMBLY AND METHOD FOR PROVIDING SAME," filed on the same day as this application.

BACKGROUND OF THE INVENTION

1. Field of the Invention

The present invention relates to a solar power generation assembly and methods for providing same. Specifically, the present invention relates to a solar power generation assembly and method for providing same involving an array of solar generation modules on a dual-incline structure, which can achieve high energy yields over a wide range of azimuths/orientations. The assembly consists of canopy wings providing for the dual-incline structure, where, depending on specifications, the canopy wings can differ in length, width, angle of inclination, structural material and solar module or other material mounted on the surface.

2. Description of the Related Art

To reduce dependence on fossil fuels (both domestic and imported) and reduce the negative environmental impacts of such fuel emissions, there is a need to increase the distributed power generation base. Similarly, there is a need to maximize the value and productivity of single-use real estate to facilitate such things as mounting for PV modules, shade for cars, shade for outdoor activities and other events and purposes. Complications and limitations associated with rooftop installations make incorporating solar power generation systems in underutilized open spaces one such means of addressing these needs. This will necessitate an increase of the electrical transmission infrastructure.

Conventional support structures for PV power systems are typically designed such that the module arrays are oriented along a single slope plane. Several drawbacks of these structures are limited sight lines from beneath the structures, avalanching of snow and ice from the system, and difficulty of deployment on parking lots that are not ideally geographically oriented.

Many arrangements have been proposed, but in general the currently available support structures for solar power generation do not integrate a high level of design aesthetics with multi-functionality and safety features. A need exists for protective structures/systems that shelter from snow, rain, and other precipitation. There is also a need for protection from excessive heat and UV rays from the sun (e.g. reducing the "heat island" effect in populated areas, limiting damage to cars, protecting people from the sun).

To both conserve water and minimize the amount of filtration required to reuse captured water, there is a need for systems which collect rainwater/melted snow before it is further polluted by contact with asphalt or other outdoor surfaces.

Accordingly, there is a need for an improved solar power generation assembly and methods for providing same.

OBJECTS AND SUMMARY OF THE INVENTION

It is an object of the invention to provide the highest value and most efficient use of solar power generation systems by addressing the need for systems which provide multiple economic and public benefits (e.g., high energy yields, shading, alternative fuel stations, charging stations, outdoor seating, WiFi, electrical outlets, lighting, media placement and other potential revenue sources, public awareness). It is therefore desirable to create multifunctional solar power systems, which also provide most, if not all of the aforementioned benefits, and may also impact the wide-spread adoption of solar technology by making its installation attractive, simpler, and more accessible to a larger segment of the potential market.

Another object of the invention is to reduce light pollution.

Another object of the invention is to facilitate the reclamation of water.

Another object of the invention is to facilitate the deployment of electrical transmission lines, telecommunications lines, cable lines and other networks.

In accomplishing the foregoing and related objects the invention provides an improved solar generation assembly and method of providing same, which combines high energy production, an aesthetically pleasing design, protection from the elements, water reclamation, media placement and a plurality of other benefits/features.

The novel system comprises a dual-inclination support structure and an array of photovoltaic module assemblies mounted on the structure, which can achieve high energy yields over a wide range of azimuths/orientations. Specifically, the individual canopy wings of the dual-incline structure can differ in length, width, angle of inclination, structural material and solar module or other material mounted on the surface. The canopy wings may also be pivoted or hinged to enhance the energy generation and/or the other functional benefits of the assembly or system. Furthermore, the improved dual-incline support system is modular and may be assembled in a variety of patterns or in a long continuous configuration in which the inclination, width and tilt of the canopy wings may vary over a long linear distance to maintain substantially consistent energy yields as the system orientation changes (e.g., along a highway).

Present invention differs from prior art because of its dual-incline structure and its multiple uses—including advertising, rainwater/precipitation and snow collection, energy transmission, and ability to place the solar cells at different angles to improve yields.

In the preferred form the support structure has a decking surface that both conceals and protects the wiring assembly and collects rainwater/precipitation by channeling water which falls through spacings between or around the modules to a gutter or drain. A space exists between the decking surface and the solar module array that allows for air ventilation for the modules and housing for electrical wiring, electrical components and/or transmission lines (e.g. high voltage electrical, cable, fiber optic). This space is enhanced when the decking surface is mounted below the purlins.

In another embodiment of the design, the decking may be removed or replaced by a non-rigid material. In this embodiment, the spacing between the solar modules can be sealed with an interstitial gasket to create a water-tight surface.

Rainwater and other precipitation would drain from the edges of the dual-incline surface towards the central drainage cavity and gutter.

In some embodiments, the support structure can include at least one of: decking elements, membrane elements, fascia, lighting elements, Internet-connection elements, WiFi elements, seating elements, planting elements, playground elements, restroom elements, media elements, photographic elements, lithographic elements, electronic or electrical elements, decorative elements, advertising elements, antennae modules, payment machines, and/or and stage elements.

In some embodiments, the decking or membrane elements comprise at least one of: fabric, wire mesh, sheet metal, perforated sheet metal, plastic, perforated plastic, cement board, perforated cement board and/or phosphorescent material.

In some embodiments, the charging and/or outlet assembly includes at least one of a fuel cell charging system.

In some embodiments, the solar generation assembly includes a security system.

In some embodiments, a system for operating a solar power generation assembly comprises at least one programmable management system.

The above, and other objects, features and advantages of the present invention will become apparent from the following description read in conjunction with the accompanying drawings, in which like reference numerals designate the same elements.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts and in which:

FIGS. 1A, 1B, 1C and 1D depict various two-dimensional embodiments of solar power generation assemblies or systems according to the invention;

FIGS. 2A, 2B and 2C depict various three-dimensional embodiments of solar power generation assemblies or systems according to the invention;

FIG. 3 depicts a three-dimensional embodiment of a solar power generation assembly or system according to the invention;

FIGS. 4A, 4B and 4C depict three-dimensional embodiments of solar power generation assemblies or systems illustrating potential array, support structure and other elements according to the invention;

FIG. 5 depicts an embodiment of a solar power generation assembly or system illustrating how water, snow and other elements may be managed according to the invention;

FIGS. 6A-6K depict various two-dimensional embodiments of solar power generation assemblies or systems according to the invention illustrating the adjustments that may be made according to the invention as a result of geographic location and orientation/azimuth of the location;

FIGS. 7A-7D and FIGS. 8A-8G depict various three-dimensional embodiments of solar power generation assemblies or systems illustrating the use of various support structures according to the invention;

FIGS. 9A-9F depict various two-dimensional embodiments of solar power generation assemblies or systems illustrating the use of pivots/hinges according to the invention;

FIGS. 10A-10K depict various three-dimensional embodiments of solar power generation assemblies or systems illustrating the use of rotational elements according to the invention;

FIGS. 11A-11C depict various three-dimensional embodiments of solar power generation assemblies or systems illustrating the use of display elements (e.g., media or decorative) according to the invention;

FIGS. 12A-12F depict various embodiments of an array and array portions that can be incorporated into a solar power generation assembly or system according to the invention;

FIGS. 13A-13B depict various three-dimensional embodiments of solar power generation assemblies or systems illustrating the use of lighting elements according to the invention;

FIG. 14 depicts an embodiment of a solar power generation assembly or system illustrating the use of charging stations and/or alternative fuel dispensing points according to the invention;

FIGS. 15A-15C depict various three-dimensional embodiments of solar power generation assemblies or systems according to the invention;

FIGS. 17A-17F, FIGS. 18A-18D, FIGS. 19A-19D, FIGS. 20A-20E and FIGS. 21A-21D depict various patterns of coverage or layout or groupings for solar power generation assemblies or systems according to the invention;

FIG. 23 depicts a descriptive flow diagram of one embodiment of a method for creation of and a system for operation of a solar power generation assembly or system according to the invention.

DETAILED DESCRIPTION OF THE PREFERRED EMBODIMENTS

Figure 10F:
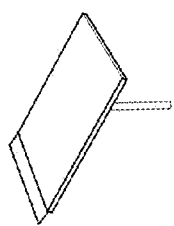
Figure 10E:
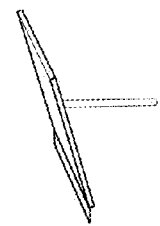
Figure 10D:
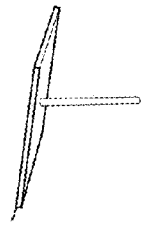
Figure 10K:
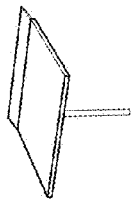
Figure 10C:
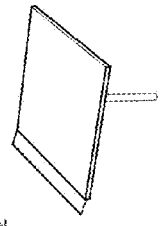
Figure 10J:
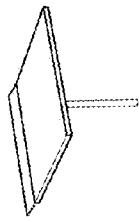
Figure 10B:
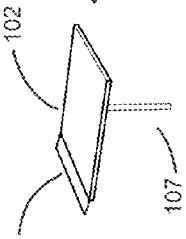
Figure 10I:
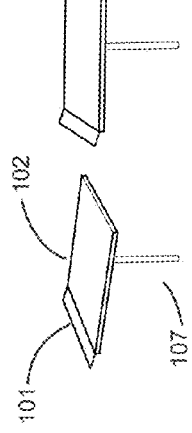
Figure 10A:
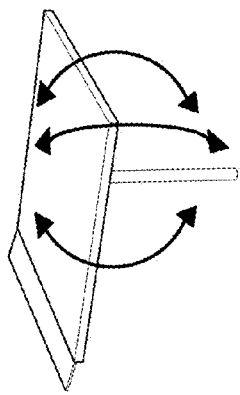
Figure 10G:
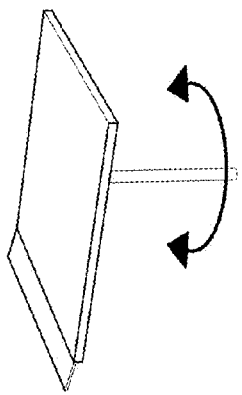

Reference will now be made in detail to several embodiments of the invention that are illustrated in the accompanying drawings. Wherever possible, same or similar reference numerals are used in the drawings and the description to refer to the same or like parts or steps. The drawings are in simplified form and are not to precise scale. For purposes of convenience and clarity only, directional terms, such as top, bottom, up, down, over, above, and below may be used with respect to the drawings. These and similar directional terms should not be construed to limit the scope of the invention in any manner. The words "connect," "couple," and similar terms with their inflectional morphemes do not necessarily denote direct and immediate connections, but may also include connections through mediate elements or devices.

FIGS. 1A, 1B, 1C, 1D, 2A, 2B and 2C illustrate the basic components of a solar power generating assembly or system 100 that is the subject of the invention. Solar power generating assembly or system 100 comprises one or more support structure 107 to or on which canopy wing A 101 and canopy wing B 102 are attached or disposed, directly or indirectly. Disposed between canopy wing A 101 and canopy wing 102 is a drainage cavity 121 through which water, ice, melting snow and other elements can pass and subsequently drop into gutter 117. As illustrated in FIGS. 1A, 1B, 1C, 1D, 2A, 2B and 2C, canopy wing A and/or canopy wing B can be curved or flat and with or without PV material. The assembly or system 100 may or may not be connected to the public electrical grid or may be connected directly to the owner's electrical system or may be used to power elements connected directly to the assembly or system 100. Assembly or system 100 may be located in open areas, parks, sidewalks, parking lots, roadways, sidewalks, parks, campuses, watersheds, reservoirs, canals, gathering places for education and/or entertainment, areas that facilitate: roller-skating, ice skating, car shows, horse riding, housing the homeless, soccer matches, tennis matches, concerts, lightshows, fitness, transportation nodes, and other uses.

Each canopy wing A 101 or canopy wing B 102 is comprised of one or more transverse supports 110 which are attached to purlins 112 and may or may not also include decking or membrane 118. Each canopy wing A 101 or canopy wing B 102 is also comprised of array support structure 114 to which array 113 is attached. Each array 113 may consist of one or more array portions 122 which may be energy producing (photovoltaic or other), decorative or signage (for advertising or design purposes, as illustrated in, for example, U.S. Provisional Application Ser. No. 61/077,851, filed Jul. 2, 2008, entitled "ADVERTISING AND PROMOTIONAL SYSTEM INVOLVING SOLAR ARRAYS AND VISUAL INDICIA AND METHODS FOR MANUFACTURING THE SAME" and related U.S. application Ser. No. 12/497,392, now U.S. Pat. No. 8,104,203 and PCT Application No. PCT/US2009/049595, both entitled "SOLAR POWER GENERATION DISPLAY ASSEMBLY AND METHOD FOR PROVIDING SAME," filed on the same day as this application) or other (water capture, lighting, heating element, etc.). The array 113 may consist of photovoltaic modules, photovoltaic thin film or any other energy producing material, or may also consist of decorative modules which are transparent or translucent, with or without decorative designs. Photovoltaic elements may be made of monocrystalline silicon, polycrystalline silicon, amorphous silicon, copper-indium-gallium-selenide (CIGS), thin film, or any other photovoltaic technology. The array 113 may also be a passive or active solar thermal system. Array portions 122 in array 113 may also include lighting or heating elements, solar thermal elements, and may include a wide range of structures including pumps, water storage containers and other elements for water collection and drainage. Array portions may also include structures for fans, pumps, tubing, elements for cooling such as spray misters, fans, skylights, antennas, cellular repeaters, illuminated panels, phosphorescent or similar panels to provide passive nighttime illumination, and other structures as may be suitable and desired. Array portions may also include signage, inverters, combiner boxes, sub-combiner boxes, direct current shutoff boxes, junction boxes, acoustical control panels, hydrogen production and/or storage devices. Array 113 may also include heating and cooling elements. Array portions 122 may be individually attached to array support 114 or connected to each other using a bonding material, gasket or other device in inter-portion gap 120. The decking or membrane 118 may be constructed of steel, aluminum, plastic, canvas or other material. In addition, the decking or membrane 118 may be one piece or several, and may be attached to the bottom, top or any other part of the purlins 112.

The decking or membrane 118 captures water, ice, snow and other elements and distributes them into the drainage cavity 121, for subsequent collection into gutter 117 and then further disposition as shown in FIG. 5. In addition, the decking or membrane 118 provides shade to cars, pedestrians and other users of the assembly or system 100. In warmer climates it may be possible to generate revenue by selling access to the shade provided by the decking or membrane 118. The transverse supports 110 which comprise part of canopy wing A 101 are inclined at canopy wing incline angle A 105, and the transverse supports 110 which comprise part of canopy wing B 102 are inclined at canopy wing B incline angle B 106. The purlins 112 and transverse supports 110 may be of steel, aluminum or other structurally appropriate materials. Incline angles 105 and 106 may be the same or different and are typically adjusted to improve the energy yield of the assembly or system 100 subject to the location of the installation site, the orientation of the installation, customer preferences, local zoning limitations, structural considerations, and other conditions which may exist at the installation site. In addition, the ability to adjust incline angles 105 and 106 provides for better sight-lines and less limitation of visibility than a single-incline system of equivalent size, thereby further enhancing the aesthetics of the installation. Inclined canopy wings also facilitate the self-cleaning of the array 113 with ambient moisture.

The transverse supports 110, which may or may not comprise part of canopy wing A 101, are of length L1 and the transverse supports 110 which may or may not comprise part of canopy wing B 102 are of length L2. Array 113, which is disposed directly or indirectly on canopy wing A 101, has a length L3, and the array 113, which is disposed directly or indirectly on canopy wing B 102 has a length L4. Lengths L1 and L2 and lengths L3 and L4 may be equal or different and are typically adjusted to improve the energy yield of the of the assembly or system 100 subject to the location of the installation site, the orientation of the installation, customer preferences, local zoning limitations, structural considerations, the incline angles 105 and 106, and other conditions that may exist at the installation site.

Each canopy wing A 101 and canopy wing B 102 also may be comprised of multiple cavities 111 between the array support 114 and the decking or membrane 118 which allows for the circulation of air 123 to facilitate the cooling of the array 113, which may increases the performance of the array 113 where, for example, the array consists of a type of photovoltaic material which typically declines in output as the temperature of the material increases. In addition, inter-portion gap 120 also allows for the circulation of air 123 from and between cavities 111 and the general environment in which assembly or system 100 is placed.

Cavities 111 may or may not contain cavity elements 115 which may be used for high- or low-voltage transmission lines, cable lines, telecommunications lines, fiber optic lines, internet systems, conduits, and other distribution systems or transmission lines, which also benefit from cooling provided by the circulation of air 123. Cavity elements 115 may rest inside cavity 111, be attached to purlins 112, and may also be attached to transverse supports 110. In the case where there is no decking or membrane 118, the cavity elements 115 would be attached to the transverse supports 110 or other appropriate element. Cavity elements 115 may or may not be connected to local telephone, cable, electrical or other networks in order to facilitate the distribution of and access to electricity, telephony, internet access, television or other services. Cavities 111 may also contain inverters and combiner boxes, sub-combiner boxes, and/or junction boxes 125. In addition, inverters and/or combiner boxes, sub-combiner boxes and/or junction boxes may rest inside cavity 111, be attached to purlins 112, and may also be attached to transverse supports 110. In the case where there is no decking or membrane 118, the inverters and/or combiner boxes, sub-combiner boxes and/or junction boxes would be attached to the transverse supports 110 or other appropriate element. Each canopy wing A 101 and canopy wing B 102 also may be comprised of outer cavity 119 which primarily serves to further ventilate array 113 and may also contain cavity elements 115. Fascia 116, which may be of aluminum composite material, other metal or other materials, provides a partial enclosure to outer cavity 119 while still allowing for the circulation of air 123. Fascia 116 may or may not include design or display elements, advertising indicia, lighting, heating or other elements, and may or may not be partially perforated to increase air circulation.

Support structure 107 may consist of a vertical support column 124 and further consist of or be disposed on or supported by foundation pier 108, which may consist of or be disposed on or supported by foundation footing 109. Both the foundation pier 108 and the foundation footing 109 may be made of concrete or other adequate foundation material subject to local requirements, structural considerations, seismic considerations, and other requirements and preferences, and may also consist of transverse support 110 which may be connected directly or indirectly to both canopy wing A 101 and canopy wing B 102 (as illustrated, for example, in FIGS. 1B and 1C) or only to one of canopy wing A 101 or canopy wing B 102.

FIG. 1D illustrates an embodiment of the assembly or system 100 that has vertical support structure 124 attached only to the transverse support 110, which is part of canopy wing B 102.

FIG. 1C illustrates an embodiment of assembly or system 100 that has a centrally located support structure 107 and in which the transverse supports 110 are contained between the decking or membrane 118 and the array 113.

FIG. 1D illustrates an embodiment of assembly or system 100, which comprises a canopy wing A 101 which may or may not have energy producing surfaces and is curved to facilitate the capture of water, snow, ice and other elements as they accumulate from canopy wing B 102. In this embodiment, canopy wing A 101 may be constructed from an energy producing material such as thin-film photovoltaic material, or may have disposed on it an array 113 which has energy producing elements. In addition, the energy producing material on canopy wing A 101 may be on both sides of the element to increase energy production. As with all embodiments of canopy wings A and B (101, 102), the canopy wing A 101 and/or canopy wing B 102 may or may not include heating elements. In this embodiment, the inclusion of heating elements in canopy wing A 101 could facilitate the melting of ice and snow for capture in drainage cavity 121.

In one embodiment illustrated in FIG. 2A, canopy wing A 101 and canopy wing B 102 are of equal length from the drainage cavity 121 to the edge. The vertical support structure 124 supports the transverse supports 110 and are disposed on, directly or indirectly, foundation pier 108 and foundation footing 109. The foundation pier 108 and foundation footing 109 may be made of concrete or any material which meets the structural, seismic and local code requirements of the site where the system is to be installed. The vertical support structure 124 may be steel or any another structural material with adequate properties and may also be of different heights. Canopy wing A incline angle 105 and canopy wing B incline angle 106 are the same, as are the canopy wing lengths L1 and L2. In this embodiment the array 113 consists of photovoltaic (PV) modules so that the assembly or system 100 also acts as a source of electricity. The electricity can be used for a variety of purposes including being transformed into alternating current and feeding the commercial electrical grid, powering lighting (elements 1301-1306) or heating elements, charging batteries and dispensing alternative fuels (elements 1401-1404), powering electrical outlets (element 1503), powering a charging station or alternative fuel station (FIG. 14).

In another embodiment illustrated in FIG. 2B, canopy wing A 101 and canopy wing B 102 are of different lengths L1 and L2 from the drainage cavity 121 to the edge. The vertical support structure 124 is mounted on foundation piers 108 and foundation footings 109 and the transverse supports 110 are both supported by vertical support structure 124. The array 113 may consist of multiple array portions 122 which may be energy-producing, decorative, light-generating, or allow for other uses. The array 113 may consist of photovoltaic modules, photovoltaic thin film or any other energy producing material, or may also consist of decorative modules which are transparent or translucent, with or without decorative designs. Photovoltaic elements may be made of monocrystalline silicon, polycrystalline silicon, amorphous silicon, copper-indium-gallium-selenide (CIGS), thin film, or any other photovoltaic technology. The array 113 may also be a passive or active solar thermal system. Array portions 122 in array 113 may also include lighting or heating elements, or solar thermal elements, and may include a wide range of structures including pumps, water storage containers and other elements for water collection and drainage. Array portions may also include structures for fans, pumps, tubing, elements for cooling such as spray misters, fans, skylights, antennas, cellular repeaters, illuminated panels, phosphorescent or similar panels to provide passive nighttime illumination, and other structures as may be suitable and desired. Array portions may also include signage, inverters, acoustical control panels, hydrogen production and storage devices. Array 113 may also include heating and cooling elements.

In another embodiment illustrated in FIG. 2C, canopy wing A 101 and canopy wing B 102 are of different lengths L1 and L2 from the drainage cavity 121 to the edge. The vertical support structure 124 is mounted on foundation piers 108 and foundation footings 109 and one set of transverse supports 110 is supported by vertical support structure 124.

All of the embodiments may include foundation pier 108, and may include foundation footing 109, subject to the requirements of the installation site.

FIG. 3 illustrates an another embodiment of the assembly or system 100 with symmetrical canopy wing A 101 and canopy wing B 102 emphasizing that transverse supports 110 may be adjusted in size to suit the requirements of the array 113.

FIG. 4A illustrates another embodiment of the assembly or system 100 with two vertical support structures 124 and consisting of array 113, which may include different array portions 122.

FIG. 4B illustrates another embodiment of the assembly or system 100 in order to show the purlins 112 are above the decking or membrane 118. It is this system design choice which creates the cavity 111 that facilitates the airflow 123 under the array 113 helping to keep it cool. In addition, cavity 111 is where the other elements such as rain, melting snow and other elements travel towards the drainage cavity 121. Inbound electricity 401 may be alternating- or direct-current depending on which elements require power, and outbound electricity 402 may be alternating- or direct-current depending on the power generated by the assembly or system 100 and what is excess beyond the needs of the system itself and can therefore be fed to the client or owner or into the electrical grid, and whether a direct- to alternating-current transformer is included as part of assembly or system 100. Outbound electricity 402 may or may not be connected to the public electrical grid or may be connected directly to the owner's electrical system or may be used to power elements connected directly to the assembly or system 100.

FIG. 4C illustrates another embodiment of the assembly or system 100 with two supports 107 consisting of vertical supports 124 joined to curved transverse supports 110, and wire chase 403 which may or may not contain electrical or other elements and conduits. Canopy wing A 101 and canopy wing B 102 are not of equal size. Canopy wing B 102 is curved to facilitate the capture of water, snow, ice and other elements as they accumulate from canopy wing A 101. In this embodiment, canopy wing B 102 may be constructed from an energy producing material such as thin-film photovoltaic material, or may have disposed on it an array 113 which has energy producing elements. In addition, the energy producing material on canopy wing B 102 may be on both sides of the element to increase energy production. As with all embodiments of canopy wings A and B (101, 102), the canopy wing A 101 and/or canopy wing B 102 may or may not include heating elements. In this embodiment, the inclusion of heating elements in canopy wing B 102 could facilitate the melting of ice and snow for capture in drainage cavity 121.

FIG. 5 illustrates another embodiment of the assembly or system 100 to demonstrate how water, snow and other elements 501 travel under the array 113 towards the drainage cavity 121 and then into gutter 117 which then feeds into downspout 502. Downspout 502 may drain at or near ground level 503 or underground, or may feed water pipe 504 which may or may not connect to a cistern or other storage or filtration container or system 505. The cistern or other storage or filtration container or system 505 may be used to store and disburse water for greywater uses including irrigation and toilet flushing, or it may be filtered to generate potable water. If there is no storage or filtration container 505, then the water collected via downspout 502 and water pipe 504 may feed directly into the local greywater system or be used for local irrigation or similar use. Downspout 502 may be located inside or adjacent to each vertical support 124 or the assembly or system 100 may be designed to contain multiple vertical supports 124 and only one downspout 502. Using one downspout 502 for an assembly or system 100 with multiple vertical supports 124 reduces the trenching and groundwork required upon installation FIGS. 6C, 6F and 6I illustrate embodiments of the assembly or system 100 where canopy wing A incline angle 105 is not equal to canopy wing B incline angle 106, canopy wing A 101 and canopy wing B 102 are different lengths L1 and L2 and vertical support structure 124 supports the transverse supports 110 under both wings.

FIGS. 6D, 6G and 6J illustrate embodiments of the assembly or system 100 where canopy wing A incline angle 105 is not equal to canopy wing B incline angle 106, canopy wing A 101 and canopy wing B 102 are different lengths L1 and L2 and vertical support structure 124 supports the transverse supports 110 under either canopy wing A 101 or canopy wing B 102, but not both.

In all cases, the wing lengths L1 and L2 and the angles of inclination 105 and 106 may be adjusted depending on the geographic location of the parking area 600 and the specific orientation/azimuth 601 of the parking spaces 602 in order to improve the energy output of the assembly or system 100 and to meet any client, zoning, or other requirements. FIGS. 6B, 6E, 6H, and 6K illustrate different potential parking lot orientations 601. FIG. 6A illustrates an embodiment of the assembly or system 100 where canopy wing A incline angle 105 and canopy wing B incline angle 106 are equal, and canopy wing A 101 and canopy wing B 102 are of equal lengths L1 and L2. FIGS. 6A, 6C, 6D, 6F, 6G, 6I, and 6J illustrate different embodiments of the assembly or system 100, which vary as the azimuth 601 of the parking lot 600 varies. The azimuth 601 determines the orientation of the canopy wings (101, 102). For example, in FIG. 6H the azimuth runs from NE (45°) to SW (225°) therefore all canopy wings A 101 will face NW typically at the minimum inclination of 1° so that water will flow to the drainage cavity 121 and the canopy wings B will be tilted at 15° which is a sufficiently steep incline to increase energy production without significantly impacting engineering and manufacturing costs. Data from PV Watts 1 (a calculator developed to determine the energy production of photovoltaic systems in different geographic locations subject to their orientation and inclination) is presented below in TABLE 1 for the NE/SW azimuths if they were located in Newark, N.J. The system size of each canopy wing A, B (101, 102) is 100 kilowatts.

TABLE 1

| NE-Facing Panel (45°) | | SW-Facing Panel (225°) | |
|---|---|---|---|
| AC kWh/year | Canopy Wing Inclination Angle | AC kWh/year | Canopy Wing Inclination Angle |
| 100,622 | 0° | 100,622 | 0° |
| 99,961 | 1° | 101,337 | 1° |
| 99,281 | 2° | 102,030 | 2° |
| 98,580 | 3° | 102,702 | 3° |
| 97,858 | 4° | 103,351 | 4° |
| 97,127 | 5° | 103,969 | 5° |
| 96,371 | 6° | 104,558 | 6° |
| 95,580 | 7° | 105,120 | 7° |
| 94,758 | 8° | 105,646 | 8° |
| 93,922 | 9° | 106,141 | 9° |
| 93,077 | 10° | 106,610 | 10° |
| 92,216 | 11° | 107,053 | 11° |
| 91,340 | 12° | 107,470 | 12° |
| 90,446 | 13° | 107,859 | 13° |
| 89,542 | 14° | 108,226 | 14° |
| 88,623 | 15° | 108,569 | 15° |

Source: PV Watts 1, using system size 100 kilowatts, 0.77 derate factor and varying inclination angle. Panel azimuths are NE (45°) and SW (225°).

In further explanation of the benefits of inclining the canopy wings A, B (101, 102) Tables 2A, 2B and 2C are presented showing the improvement in yield of an assembly or system 100 with equal sized canopy wings A, B (101, 102) and canopy wing A incline 105 and canopy wing B incline 106, and also another assembly or system 100 with canopy wing A 101 supporting an array 113 of PV panels three times the area of an array 113 on canopy wing B 102 and canopy wing A incline 105 and canopy wing B incline 106, and also another assembly or system 100 with equal sized canopy wings A, B (101, 102) and canopy wing A incline 105 and canopy wing B incline 106. For reference, the system outputs of the preceding systems 100 are compared to the output of an assembly or system 100 where the canopy wing incline angles (105, 106) are both zero. Data is presented for three different geographic locations: Los Angeles, Calif. (Table 2A), Newark, N.J. (Table 2B) and Raleigh, N.C. (Table 2C).

TABLE 2A

Overall Summary for Los Angeles, CA using PV Watts 1

| Azimuths 601 NORTH (0°)/SOUTH (180°) | Canopy Wing Angles 105 and 106 (N/S) | System Production AC/year (kWh) | kWh gain | % Gain |
|---|---|---|---|---|
| Equal Wings | 1°/15° | 135,375 | 6,091 | 4.7% |
| Asymmetrical Wings 3:1 | 1°/15° | 138,956 | 9,672 | 7.5% |
| Standard 5/5 | 5°/5° | 129,111 | (174) | −0.1% |
| Flat/Flat | 0°/0° | 129,284 | 0 | 0.0% |

| Azimuths 601 EAST (90°)/WEST (270°) | Canopy Wing Angles 105 and 106 (E/W) | System Production AC/year (kWh) | kWh gain | % Gain |
|---|---|---|---|---|
| Equal Wings | 1°/7° | 129,699 | 415 | 0.3% |
| Asymmetrical Wings 3:1 | 1°/7° | 129,984 | 700 | 0.5% |
| Standard 5/5 | 5°/5° | 129,167 | (118) | −0.1% |
| Flat/Flat | 0°/0° | 129,284 | 0 | 0.0% |

| Azimuths 601 NW (315°)/SE (135°) | Canopy Wing Angles 105 and 106 (NW/SE) | System Production AC/year (kWh) | kWh gain | % Gain |
|---|---|---|---|---|
| Equal Wings | 1°/15° | 132,350 | 3,066 | 2.4% |
| Asymmetrical Wings 3:1 | 1°/15° | 134,183 | 4,899 | 3.8% |
| Standard 5/5 | 5°/5° | 129,165 | 0 | −0.1% |
| Flat/Flat | 0°/0° | 129,284 | (120) | 0.0% |

| Azimuths 601 NE (45°)/SW (225°) | Canopy Wing Angles Angles (NE/SW) | System Production AC/year (kWh) | kWh gain | % Gain |
|---|---|---|---|---|
| Equal Wings | 1°/15° | 134,167 | 4,883 | 3.8% |
| Asymmetrical Wings 3:1 | 1°/15° | 137,054 | 7,770 | 6.0% |
| Standard 5/5 | 5°/5° | 129,120 | (164) | −0.1% |
| Flat/Flat | 0°/0° | 129,284 | 0 | 0.0% |

Comparison of Equal size canopy wings with custom inclines, 3:1 canopy wing size with custom inclines, equal canopy wing size with 5° inclines, and equal size canopy wings laid flat

TABLE 2B

Overall Summary for Newark, NJ using PV Watts 1

| Azimuths 601 NORTH (0°)/SOUTH (180°) | Canopy Wing Angles 105 and 106 (N/S) | System Production AC/year (kWh) | kWh gain | % Gain |
|---|---|---|---|---|
| Equal Wings | 1°/15° | 106,303 | 5,681 | 5.6% |
| Asymmetrical Wings 3:1 | 1°/15° | 109,631 | 9,009 | 9.0% |
| Standard 5/5 | 5°/5° | 100,488 | (135) | −0.1% |
| Flat/Flat | 0°/0° | 100,622 | 0 | 0.0% |

| Azimuths 601 EAST (90°)/WEST (270°) | Canopy Wing Angles 105 and 106 (E/W) | System Production AC/year (kWh) | kWh gain | % Gain |
|---|---|---|---|---|
| Equal Wings | 4°/1° | 100,676 | 54 | 0.1% |
| Asymmetrical Wings 3:1 | 4°/1° | 100,704 | 82 | 0.1% |
| Standard 5/5 | 5°/5° | 100,564 | (58) | −0.1% |
| Flat/Flat | 0°/0° | 100,622 | 0 | 0.0% |

| Azimuths 601 NW (315°)/SE (135°) | Canopy Wing Angles 105 and 106 (NW/SE) | System Production AC/year (kWh) | kWh gain | % Gain |
|---|---|---|---|---|
| Equal Wings | 1°/15° | 104,471 | 3,849 | 3.8% |
| Asymmetrical Wings 3:1 | 1°/15° | 106,746 | 6,124 | 6.1% |
| Standard 5/5 | 5°/5° | 100,498 | (124) | −0.1% |
| Flat/Flat | 0°/0° | 100,622 | 0 | 0.0% |

| Azimuths 601 NE (45°)/SW (225°) | Canopy Wing Angles Angles (NE/SW) | System Production AC/year (kWh) | kWh gain | % Gain |
|---|---|---|---|---|
| Equal Wings | 1°/15° | 104,265 | 3,643 | 3.6% |
| Asymmetrical Wings 3:1 | 1°/15° | 106,417 | 5,795 | 5.8% |

TABLE 2B-continued

Overall Summary for Newark, NJ using PV Watts 1

| | | | | |
|---|---|---|---|---|
| Standard 5/5 | 5°/5° | 100,548 | (74) | −0.1% |
| Flat/Flat | 0°/0° | 100,622 | 0 | 0.0% |

Comparison of Equal size canopy wings with custom inclines, 3:1 canopy wing size with custom inclines, equal canopy wing size with 5° inclines, and equal size canopy wings laid flat

TABLE 2C

Overall Summary for Raleigh, NC using PV Watts 1

| Azimuths 601 NORTH (0°)/SOUTH (180°) | Canopy Wing Angles 105 and 106 (N/S) | System Production AC/year (kWh) | kWh gain | % Gain |
|---|---|---|---|---|
| Equal Wings | 1°/15° | 120,007 | 5,574 | 4.9% |
| Asymmetrical Wings 3:1 | 1°/15° | 123,284 | 8,851 | 7.7% |
| Standard 5/5 | 5°/5° | 114,290 | (143) | −0.1% |
| Flat/Flat | 0°/0° | 114,433 | 0 | 0.0% |

| Azimuths 601 EAST (90°)/WEST (270°) | Canopy Wing Angles 105 and 106 (E/W) | System Production AC/year (kWh) | kWh gain | % Gain |
|---|---|---|---|---|
| Equal Wings | 2°/2° | 114,494 | 61 | 0.1% |
| Asymmetrical Wings 3:1 | 2°/2° | 114,510 | 77 | 0.1% |
| Standard 5/5 | 5°/5° | 114,371 | (62) | −0.1% |
| Flat/Flat | 0°/0° | 114,433 | 0 | 0.0% |

| Azimuths 601 NW (315°)/SE (135°) | Canopy Wing Angles 105 and 106 (NW/SE) | System Production AC/year (kWh) | kWh gain | % Gain |
|---|---|---|---|---|
| Equal Wings | 1°/15° | 118,075 | 3,642 | 3.2% |
| Asymmetrical Wings 3:1 | 1°/15° | 120,243 | 5,810 | 5.1% |
| Standard 5/5 | 5°/5° | 114,335 | (98) | −0.1% |
| Flat/Flat | 0°/0° | 114,433 | 0 | 0.0% |

| Azimuths 601 NE (45°)/SW (225°) | Canopy Wing Angles Angles (NE/SW) | System Production AC/year (kWh) | kWh gain | % Gain |
|---|---|---|---|---|
| Equal Wings | 1°/15° | 118,189 | 3,756 | 3.3% |
| Asymmetrical Wings 3:1 | 1°/15° | 120,400 | 5,967 | 5.2% |
| Standard 5/5 | 5°/5° | 114,315 | (118) | −0.1% |
| Flat/Flat | 0°/0° | 114,433 | 0 | 0.0% |

Comparison of Equal size canopy wings with custom inclines, 3:1 canopy wing size with custom inclines, equal canopy wing size with 5° inclines, and equal size canopy wings laid flat FIG. 7B illustrates an embodiment of the system equivalent to FIG. 1A, with a single vertical support 124 supporting each pair of transverse supports 110.

FIG. 7A illustrates an embodiment of the assembly or system 100 with separate vertical support structure 124 to support canopy wing A 101 and canopy wing B 102.

FIG. 7D illustrates an embodiment of the assembly or system 100 with complex vertical support 701 to support canopy wing A 101 and another vertical support 701 to support canopy wing B 102. The various complex vertical supports 701 may be side by side or at different locations in order to adequately support canopy wings A and B (101, 102).

FIG. 7C illustrates an embodiment of the assembly or system 100 with complex vertical support structure 701 supporting canopy wing A 101 and supporting canopy wing B 102, where the various embodiments of complex vertical support structure 701 overlap when seen from a section or perspective view. Complex vertical support structure 701 may comprise one piece of steel or other structural material that is bent, or may comprise multiple pieces of steel or other structural material that are welded, bolted or otherwise joined together.

FIGS. 8A-8G illustrate different embodiments of the assembly or system 100 where the vertical support structure 124 and transverse supports 110 vary in size, orientation, connection angle and method, form of curvature, and general design, and the canopy wings A 101 and canopy wings B 102 also vary in their lengths L1 and L2.

FIG. 8D illustrates an embodiment of the assembly or system 100 which comprises a plurality of canopy wings A 101 of varying sizes attached to a plurality of vertical support structures 124 and transverse supports 110 of varying heights, inclinations and other dimensions. The curvature of transverse supports 110 each have a radius 801, all of which may be the same or different.

FIG. 8G illustrates an embodiment of the assembly or system 100 which comprises vertical support structure 124 which are individually or jointly supported by horizontal base supports 802.

FIGS. 9A-9F illustrate embodiments of the assembly or system 100 which include one or more pivots/hinges 901. Pivot/hinge 901 may be constructed in a variety of ways which will be familiar to those skilled in the art. Pivot/hinge 901 allows for the adjustment of attached canopy wings A and/or B (101, 102) throughout the year in order to increase the energy output of the assembly or system 100, manage energy yields, wind loads, snow loads, sight lines, water capture, and other requirements and preferences. Adjustments may be performed manually or through the operation of mechanical or motorized systems.

FIG. 9A illustrates an embodiment of the assembly or system 100 which comprises one or more complex vertical supports 701 which are cantilevered to connect to pivot/hinge 901 and canopy wing A 101 and canopy wing B 102. Each canopy wing incline angle A 105 and canopy wing incline angle B 106 may be adjusted individually and may or may not be equal in order to adjust the energy output of the assembly or system 100 and also to incorporate specific site requirements, including wind loads, sight lines, water capture, and other requirements and preferences.

FIG. 9B illustrates an embodiment of the assembly or system 100 which comprises vertical support structure 124 without cantilevering supporting hidden transverse supports 110, which comprise part of canopy wing A 101 and canopy wing B 102 and which in turn are attached to pivot/hinge 901 to allow for the individual adjustment of canopy wing incline angle A 105 and canopy wing B incline angle 106.

FIG. 9C illustrates an embodiment of the assembly or system 100 with a pivot/hinge 901 to which canopy wing A 101 and canopy wing B 102 are attached and in which canopy wing B 102 has a hinge interspersed within it so that the portions of canopy wing B 102 can be adjusted at various incline angles 903. Canopy wing A incline angle 105, canopy wing B incline angles 106 and 903 are all adjustable and need not be equal. In this embodiment, canopy wing A incline angle 105 and canopy wing incline angle 106 are adjusted so that canopy wing A 101 and a portion of canopy wing B 102 form a flat surface at an incline of canopy wing A incline angle 105 and the other portion of canopy wing B incline angle 903 is adjusted so that the other portion of canopy wing B 102 forms a dual-incline structure.

FIG. 9E illustrates an embodiment of assembly or system 100 which comprises three pivot/hinges 901, allowing portions of canopy wing A 101 and canopy wing B 102 to adjust at various points and at various incline angles 105, 106, 902, and 903. Each of the canopy wing incline angles 105, 106, 902, and 903 may be the same or different to incorporate specific site requirements, including energy yields, wind loads, sight lines, water capture, and other requirements and preferences.

FIG. 9F illustrates an embodiment of assembly or system 100 where canopy wing incline angle A 105 and canopy wing incline angle B 106 are both equal to zero degrees so that a portion of canopy wing A 101 and a portion of canopy wing B 102 form a flat central area and the other portions may be inclined or flat to incorporate specific site requirements, including energy yields, wind loads, sight lines, water capture, and other requirements and preferences.

FIGS. 10A-10K illustrate embodiments of assembly or system 100 with different ways of inclination. FIGS. 10A-10F illustrate embodiments of assembly or system 100 where canopy wing A 101 and canopy wing B 102 may be inclined along the axis of drainage cavity 121, perpendicular to the axis of drainage cavity 121, and at an angle to the axis of drainage cavity 121 all of which serve to allow for a highly customizable inclination for the entire assembly or system 100 in order to improve energy yields, facilitate water capture, increase safety, and meet the aesthetic and other requirements of the site.

FIGS. 10G-10K illustrate embodiments of assembly or system 100 where canopy wing A 101 and canopy wing B 102 may be rotated in the plane perpendicular to the axis of vertical support structure 124. In addition, any assembly or system 100 may be rotated in a combination of all of the above described methods.

FIGS. 11A-11C illustrate embodiments of the assembly or system 100 with various media or decorative elements. Various display elements may be included in the assembly or system 100 among others, end fascia display element 1101, side fascia display element 1102, transverse support display element 1103, vertical support display element 1104, central divider display element 1105, and ventral display element 1106.

FIG. 11C illustrates an embodiment of the assembly or system 100 with array 113 and display element 1107. Any, all or some of the display elements enumerated may contain advertising, decorative, display, photographic, lithographic, electronic, electrical, or other display materials. The display elements allow the owner of the assembly or system 100 to customize the appearance of the system to suit site requirements, customer preferences and other needs, while at the same time creating the possibility of revenue generation via the sale of said display elements for advertising and the possibility of an enhanced parking experience by displaying pleasing images or useful information (e.g. weather conditions, traffic conditions, sporting scores, financial market information).

FIGS. 12A-12B illustrate embodiments of array 113 consisting of array portions 122 where the array portions may or may not have decorative, advertising, display or other elements, and are subsequently arranged in different patterns. As noted above, such display elements are illustrated in, for example, U.S. Provisional Application Ser. No. 61/077,851, filed Jul. 2, 2008, entitled "ADVERTISING AND PROMOTIONAL SYSTEM INVOLVING SOLAR ARRAYS AND VISUAL INDICIA AND METHODS FOR MANUFACTURING THE SAME" and related U.S. application Ser. No. 12/497,392, now U.S. Pat. No. 8,104,203 and PCT Application No. PCT/US2009/049595, both entitled "SOLAR POWER GENERATION DISPLAY ASSEMBLY AND METHOD FOR PROVIDING SAME," filed on the same day as this application.

FIGS. 13A-13B illustrate embodiments of the assembly or system 100 with various lighting elements. Various lighting elements may be included in the assembly or system 100 among others, end fascia lighting element 1301, side fascia lighting element 1302, transverse support lighting element 1303, vertical support lighting element 1304, central divider lighting element 1305, and ventral lighting element 1306. Lighting elements may be metal halide, LED, halogen, incandescent, other lighting technology or any combination of several technologies. Lighting elements are oriented to be downward facing or directed towards the canopy wings A, B (101, 102) to reflect down and therefore do not add to light pollution.

FIG. 14 illustrates an embodiment of assembly or system 100 which also includes several alternative energy charging stations 1401 and 1403, and alternative fuel dispensing points 1402, and alternating- and/or direct-current outlets or charging points 1503, all of which may or may not be suspended from lateral support 1404, may be ground mounted, attached to the underside of a canopy wing A 101 or canopy wing B 102, and which connection and transmission elements may or may not be carried inside cavity 111 inside a cavity element 115, or directly inside a cavity element 115 where there is no cavity 111. The flexibility of the elements allows for one assembly or system 100 to provide for the charging and dispensing of multiple fuel technologies at one point, such as electrical charging, hydrogen generation, and hydrogen dispensing, and also to later incorporate additional technologies as they are developed, so that vehicles 1405 of various technologies may all benefit from the availability of this and related embodiments.

FIGS. 15A-15C illustrate embodiments of assembly or system 100 which may be used in parks, gardens, playgrounds, corporate campuses, universities, schools, colleges, and other sites as previously described. These embodiments are designed to have a smaller footprint and simplified canopy wings A and B (101, 102), which may or may not have a solid decking or membrane 118. FIG. 15A illustrates an embodiment of assembly or system 100 which comprises vertical support structure 124 to which multiple transverse supports 110 are attached and which support canopy wing A 101 and canopy wing B 102. Column accessories 1501 are attached and may be elements including plants, planters, bird houses, bird feeders, wireless hubs or routers, loudspeakers and other elements depending on the preferences of the owner, the weather conditions of the site, and local regulations. Seating 1502 may be circular around vertical support structure 124 or any other shape such as square, rectangular, triangular, and oval. Alternating- and/or direct-current outlets or charging points 1503 may also be available to allow for the re-charging and powering of laptops, personal digital assistants, mobile telephones, and other electrical or electronic devices.

FIG. 15B illustrates an embodiment of assembly or system 100 with vertical support display elements 1103 and transverse support display elements 1104, which may be decorative, advertising, reflect the name of the owner or campus, or other display information.

FIG. 15C illustrates an embodiment of assembly or system 100 with vertical support lighting element 1304, transverse support lighting element 1303, and ventral lighting element 1306. Alternative embodiments may reflect a combination of lighting and display elements, accessories, and outlets/charging points.

Figure 16A:
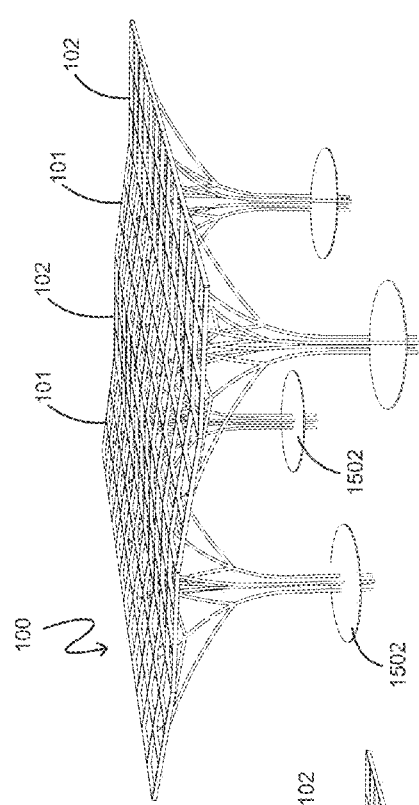
FIGS. 16A-16C depict various three-dimensional embodiments of solar power generation assemblies or systems illustrating the joining of such assemblies or systems according to the invention.
Figure 16B:
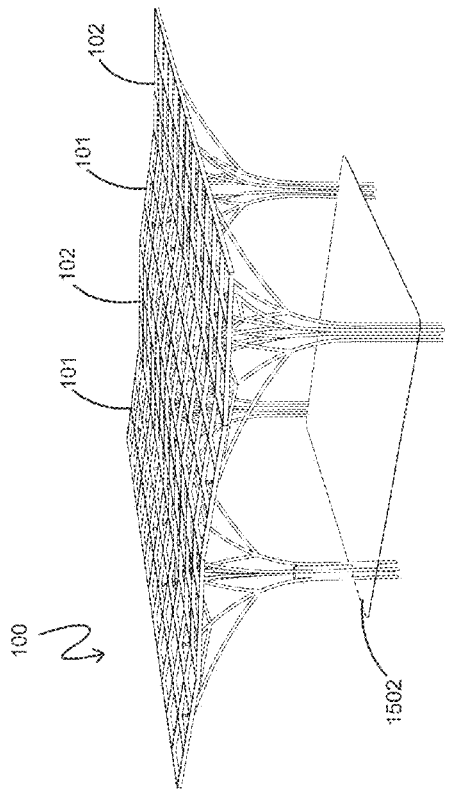
Figure 16C:
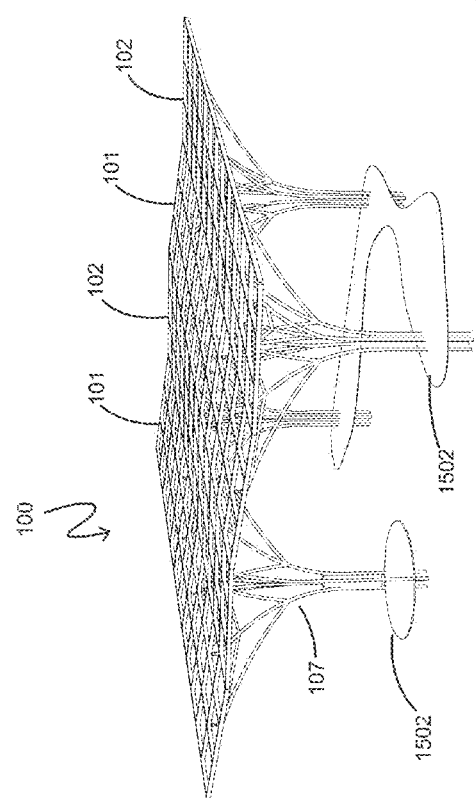

FIGS. 16A-16C illustrate embodiments of assembly or system 100 where several canopy wings A and B (101, 102) are joined together or placed adjacent and have one or more seating 1502 elements.

FIGS. 17A-17F illustrate embodiments of assembly or system 100 in various groupings 1700 consisting of more than one assembly or system 100, and illustrate different patterns of coverage that assembly or system 100 may provide over a particular site. Patterns of coverage may be geometric, a design, lettering, or any preferred layout. FIG. 17A illustrates an embodiment of grouping 1700 where each assembly or system 100 covers one grouping of parking spaces 602.

FIG. 17B illustrates an embodiment of grouping 1700 where each assembly or system 100 covers a curving grouping of parking spaces 602.

FIG. 17C illustrates an embodiment of grouping 1700 where each assembly or system 100 covers a row of space which may be a park, garden, campus, parking space or other location.

FIG. 17D illustrates an embodiment of grouping 1700 where the plan view of the site shows the arrangement of systems 100 to reveal a shape of curved and straight boundaries.

FIG. 17E illustrates an embodiment of grouping 1700 which completely covers the site.

FIG. 17F illustrates an embodiment of multiple groupings 1700 each of which comprises multiple systems 100.

FIGS. 18A-18D illustrate embodiments of groupings 1700 with different shapes for canopy wings A and B (101, 102), such as circular (FIG. 18A), triangular (FIG. 18B), hexagonal (FIG. 18C), and square or rectangular (FIG. 18D). FIGS. 19A-19D illustrate embodiments of groupings 1700. FIG. 19A illustrates an embodiment of grouping 1700 where each assembly or system 100 consists of support structure 107, canopy wing A 101, canopy wing B 102, with canopy wing A incline angle 105 equal to canopy wing B incline angle 106, where canopy wing A length L1 and L2 are equal, and which are placed adjacent to limit or eliminate rainfall between two adjacent systems 100.

FIG. 19B illustrates an embodiment of grouping 1700 where each assembly or system 100 consists of support structure 107, canopy wing A 101, canopy wing B 102, with canopy wing A incline angle 105 and canopy wing B incline angle 106, where each assembly or system 100 is directly adjacent or where each support structure 107 may or may not be of varying heights to provide a grouping 1700 with systems 100 of alternating or otherwise varying heights.

FIG. 19C illustrates an embodiment of grouping 1700 where canopy wing A length L1 is not equal to canopy wing B length L2, and where support structure 107 is attached only to the transverse supports 110 of canopy wing B 102.

FIG. 19D illustrates an embodiment of grouping 1700 where canopy wing A incline angle 105 is equal to canopy wing B incline angle 106.

FIGS. 20A-20E illustrates embodiments of groupings 1700 similar to that illustrated and explained with respect to FIGS. 19A-19D.

FIG. 21A illustrates a plan view of travel route 2101 such as a highway, road, railway, tramway, canal, river, walkway or other conduit for transportation which has multiple groupings 1700 in and around it. The groupings 1700 can be used to provide shade, shelter and protection from the elements, generate electricity, carry transmission and distribution conduits and wires, and other uses. For example, groupings 1700 may be installed along the center median of a highway and also along each shoulder of the same highway to generate electricity which is distributed to the local utility grids, to capture water which is channeled to local water systems for greywater usage or possible filtration, and to carry a variety of telephony, cable, media, electrical and other conduits to speed the expansion of the electrical grid, quickly grow the reach of cable and telephony to rural and other locations, and generally improve the power and communications infrastructure of the site.

FIG. 21B illustrates an elevation view of travel route 2101 with groupings 1700 and travel vehicles 2102.

FIG. 21C illustrates a section view of travel route 2101 with groupings 1700 and travel vehicles 2102.

FIG. 21D illustrates a section view of an alternate embodiment along a railway or tramway travel route 2101 with passenger and freight vehicles 2103.

Figure 22:
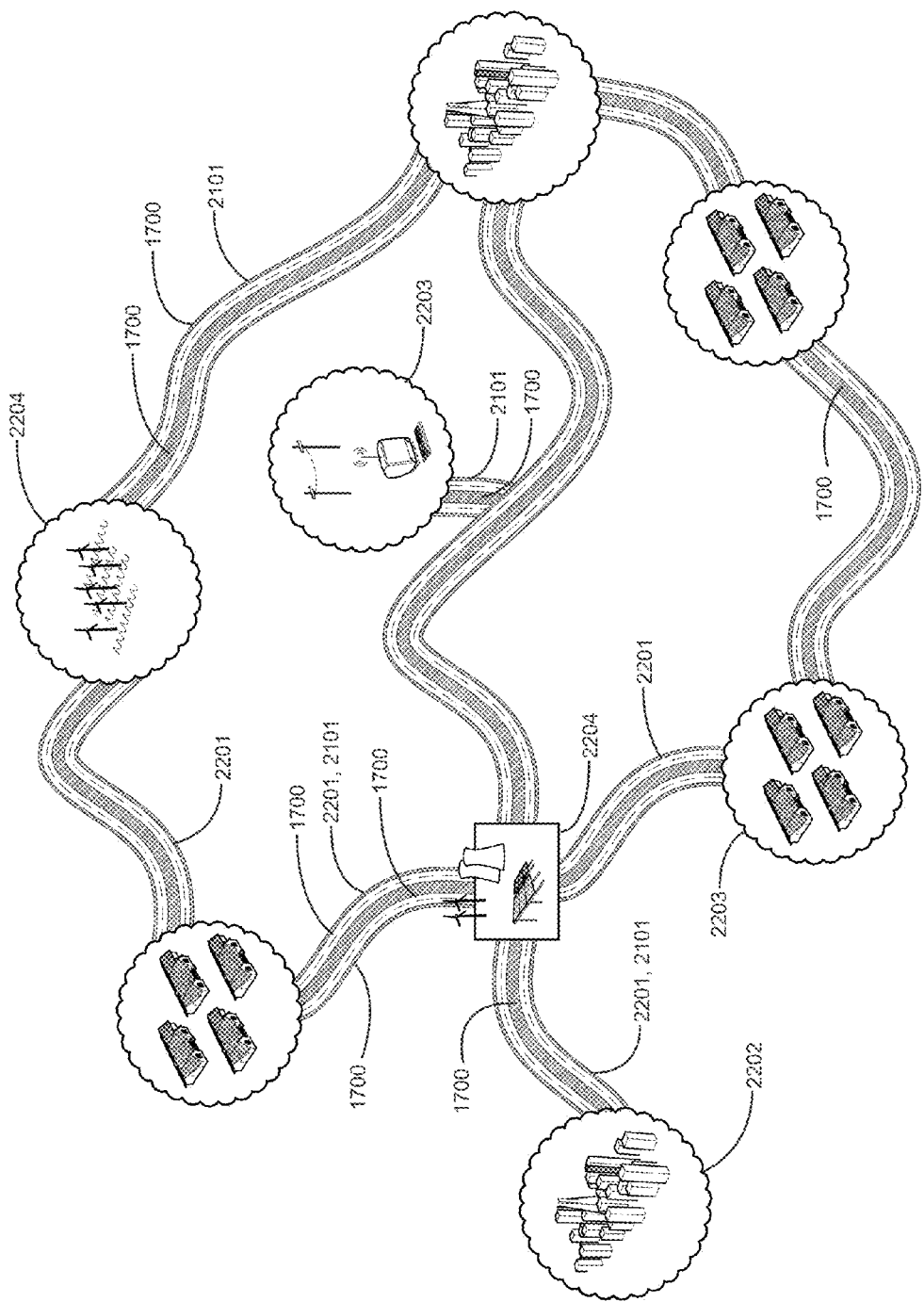
FIG. 22 depicts a simplified system view of various patterns of coverage or layout or groupings for solar power generation assemblies or systems illustrating how various locations or facilities can be linked according to the invention.

FIG. 22 illustrates a simplified system view of how cities 2202, towns, suburbs, exurbs, rural and other inhabited areas 2203, power transmission and distribution systems, telecommunications network, cable network, and other communications and alternative and conventional power generation facilities, power storage facilities, can all be linked by travel routes 2101 where multiple groupings 1700 are installed. In this way electricity generated at 2204 can be transmitted to cities 2202 and other inhabited regions 2203 using existing transmission facilities and also using transmission networks that can be quickly deployed as part of 1700. In addition, electricity generated by groupings 1700 can be tied into existing transmission networks, distributed by new transmission networks deployed with 1700 or fed in part or in whole directly to private or public locations without first going through a utility-owned network. Incline angles 105 and 106 may be varying throughout the groupings 1700 or may be fixed at angles which provide a consistently high yield regardless of orientation, for example each 105 and 106 set equal to 5°.

FIG. 23 illustrates a method 2300 for developing and designing a grouping 1700 or individual assembly or system 100. FIG. 23 shows an initial step of determining site specifics 2300A which may include geographic location, orientation/azimuth of the desired grouping 1700 or assembly or system 100, altitude, and other data points, preferences and regulations, a second step 2300B of determining of system size, canopy incline angles 105, 106 and system output based on previously determined site specifics, further variables 2300C and other necessary inputs. A third step 2300D is shown of determining canopy wing A, B 101, 102 dimensions L1, L2, and linear feet of total assembly or system 100 or grouping 1700, and also the number of vertical supports 124 which will be required, based on input variables 2300E. A fourth step 2300F is shown of determining the physical layout of the assemblies or systems 100 or groupings 1700 on the installation site, of determining the final system size, recalculating the system output and determining the number of photovoltaic panels, photovoltaic thin film or quantity of other energy producing material required based on input variables 2300G. A fifth step 2300H of constructing the assembly or system 100 or grouping 1700 is followed by an installation 2300J and testing 2300I which may iterate until installation is complete and functional. Lastly, a management system overview 2300K is provided to familiarize the client with the full installation, and is then followed by remote management of the system 2300L to monitor energy production, change display media as required, determine maintenance requirements, and other monitoring as necessary.

ILLUSTRATIVE EXAMPLE

Client has requested a 1 megawatt (MW) system for their site in Newark, N.J. Parking aisles run southeast/northwest (therefore cars are parked facing northeast and southwest). Client requests the system be able to withstand a wind load of 90 mph and a snow load of 30 lbs. per square foot. In addition, the client requests an asymmetric dual-incline structure where the ratio of the canopy wings is 3:1 (i.e., one set of wings may be 30 feet from center to outside edge and the other set of wings may be 10 feet form center to outside edge. The actual dimensions will be calculated in this example.). Client also requests steel decking, drainage connected to a set of cisterns, and that the whole system be connected to the client's electrical system. Client has specified Suntech 220 panels. Client also requests their corporate logo be placed on the central divider, end fascia and side fascia of each canopy, and the division name be placed on the transverse supports. Lastly, the client requests that all system output calculations be performed using PV Watts Version 1 (available at http://www.nrel.gov/rredc/pvwatts/version1.html).

Given the panels requested by the client, the large canopies will have strips of 8 panels running from the center cavity to the outside edge, and the small canopies will have strips of 4 panels. The exact system size is therefore 1.0056 megawatts. The small canopies will be approximately 13.5 feet from center to edge and the large canopies will be approximately 27 feet. Using spacing of 32 feet from the center of one vertical support to the next results in a requirement of 59 columns in total for the system. The site layout is such that 3 systems of 15 columns and 1 system of 14 columns will be laid out.

Given a system size of 1 megawatt, and knowing that the canopies will tilt north-east and south-west, and further knowing that the south-west facing canopies will contain three times as many panels as the north-east facing canopies, PV Watts Version 1 is used to calculate the system production. Using the data from PV Watts shows that the south-west facing canopies should be inclined to 15° (further inclination increases output, but with decreasing benefits for each additional degree of inclination and requires additional engineering and construction costs). Using the data from PV Watts as shown previously in Table 1, shows that the north-east facing canopies should be inclined to 1° (no inclination would be slightly better, but in order to capture the safety and water reclamation benefits of the dual-incline system, a minimum of 1° is suggested). Total system output will be 1,064,763 kilowatt-hours (kWh).

At this point the manufacturing, transportation, labor, and parts orders may be initiated to prepare for installation and operation of the assembly or system.

As employed herein, those of skill in the art of solar power generation will recognize distinctions between the phrases array, cell, module, amorphous, and crystalline. However, it will be recognized by those of skill in the art, that when viewed in the particular exemplary circumstance the use of array or module or cell may be interchanged without restriction or confusion.

In the claims, means- or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

What is claimed is:

1. A solar power generation assembly comprising:
   a dual-incline structure installed at a geographic location comprising:
      a first canopy wing and a second canopy wing, wherein said first canopy wing and said second canopy wing extend from a longitudinal axis;
      a first array comprising energy producing material disposed on said first canopy wing;
      a second array comprising energy producing material disposed on said second canopy wing;
      a plurality of support columns each having a first end connected to a ground surface and extending substantially vertically along a central axis from said first end to a second end, wherein said plurality of support columns are arranged along the longitudinal axis, and wherein the plurality of support columns are positioned in a first plane;
      a plurality of support beams, each of said plurality of support beams having a support beam end and an opposing support beam end, each of said plurality of support beams coupled to said second end of one of said plurality of support columns, wherein each support beam is positioned to provide support for one of said first canopy wing at a first angle formed between one of the plurality of support beams and one of the plurality of support columns and said second canopy wing at a second angle formed between one of the plurality of support beams and one of the plurality of support columns and wherein said opposing support beam ends of said plurality of support beams are positioned higher from the ground surface than said support beam ends of said plurality of support beams;

a plurality of purlins, wherein at least one of the plurality of purlins is disposed between one of the plurality of support beams and the first array creating a cavity therebetween into which precipitation on a top surface of the first array falls;

a gap between the first array and the second array through which the precipitation on the top surface of the first array falls;

a gutter extending substantially parallel to the longitudinal axis such that the precipitation that drains through the gap is directed toward one of the plurality of support columns; and a downspout supported by one of the plurality of support columns toward which the gutter directs the precipitation away from the dual-incline structure;

wherein said first array is positioned in a second plane with respect to the first plane along the longitudinal axis, wherein said first array is positioned at the first angle defined by said plurality of support beams and wherein said first array is fixed in position such that said first array is non-adjustable upon installation; and wherein said second array is positioned in a third plane with respect to the first plane, the third plane is different than the second plane, the second and third planes intersecting at the longitudinal axis, wherein said second array is positioned at the second angle defined by said plurality of support beams, the second angle is different than and not the supplement of the first angle, and wherein said second array is fixed in position such that said second array is non-adjustable upon installation.

2. The solar power generation assembly according to claim 1 wherein said energy producing material comprises at least one of: photovoltaic modules, photovoltaic thin film, light concentrator type of solar panel, and solar thermal.

3. The solar power generation assembly according to claim 1 further comprising at least one cavity element that includes at least one of transmission lines, high-voltage transmission lines, low-voltage transmission lines, cable lines, telecommunications lines, fiber optic lines, Internet systems, and conduit elements.

4. The solar power generation assembly according to claim 1 further comprising at least one charging and outlet assembly.

5. The solar power generation assembly according to claim 1 further comprising at least one of a security system and a monitoring system.

6. The solar power generation assembly according to claim 1 wherein said dual-incline structure further comprises at least one skylight.

7. The solar power generation assembly according to claim 4 wherein said charging and outlet assembly comprises at least one of:

a fuel cell charging system, a hydrogen production device, an inverter for converting energy from direct current to alternating current electricity, and an electrical outlet.

8. The solar power generation assembly according to claim 1 wherein said solar power generation assembly is modular.

9. A method for providing a solar power generation assembly comprising:

determining an orientation of a dual-incline structure installed at a geographic location, wherein said dual-incline structure comprises a first canopy wing and a second canopy wing;

determining a first size of said first canopy wing and a second size of said second canopy wing;

providing the solar power generation assembly comprising:

said dual-incline structure comprising:

a first array comprising energy producing material disposed on said first canopy wing;

a second array comprising energy producing material disposed on said second canopy wing; and a plurality of support columns, each having a first end connected to a ground surface and extending substantially vertically along a central axis from said first end to a second end, wherein said plurality of support columns are arranged along a longitudinal axis, and wherein the plurality of support columns are positioned in a first plane;

a plurality of support beams, each of said plurality of support beams having a support beam end and an opposing support beam end, each of said plurality of support beams coupled to said second end of one of said plurality of support columns, wherein each support beam is positioned to provide support for one of said first canopy wing at a first angle formed between one of the plurality of support beams and one of the plurality of support columns and said second canopy wing at a second angle formed between one of the plurality of support beams and one of the plurality of support columns and wherein said opposing support beam ends of said plurality of support beams are positioned higher from the ground surface than said support beam ends of said plurality of support beams;

a plurality of purlins, wherein at least one of the plurality of purlins is disposed between one of the plurality of support beams and the first array creating a cavity therebetween into which precipitation on a top surface of the first array falls;

a gap between the first array and the second array through which the precipitation on the top surface of the first array falls;

a gutter extending substantially parallel to the longitudinal axis such that the precipitation that drains through the gap is directed toward one of the plurality of support columns; and a downspout supported one of the plurality of support columns toward which the gutter directs the precipitation away from the dual-incline structure;

wherein the first array is positioned in a second plane with respect to the first plane along the longitudinal axis and wherein the first array is positioned at the first angle defined by said plurality of support beams, wherein the second array is positioned in a third plane with respect to the first plane and wherein the second array is positioned at the second angle defined by said plurality of support beams, the third plane is different than the second plane, the second and third planes intersecting at the longitudinal axis, the second angle is different than and not the supplement of the first angle; and wherein the first array is fixed in position such that the first array is non-adjustable upon installation and wherein the second array is fixed in position such that the second array is non-adjustable upon installation; and constructing said solar power generation assembly comprising:
    erecting said plurality of support columns;
    connecting each of said support beams directly or indirectly to at least one of said plurality of support columns; and
    mounting said first canopy wing and said second canopy wing directly or indirectly to at least one of said plurality of support beams.

10. The method for providing a solar power generation assembly according to claim 9 wherein said energy producing material comprises at least one of photovoltaic modules, photovoltaic thin film, light concentrator type of solar panel and solar thermal.

11. The method for providing a solar power generation assembly according to claim 9 wherein said solar power generation assembly is modular.

12. A system for operating a solar power generation assembly comprising:
    at least one programmable management system that:
        determines an orientation of a dual-incline structure installed at a geographic location, wherein said dual-incline structure comprises a first canopy wing and a second canopy wing;
    the solar power generation assembly comprising:
        said dual-incline structure at said determined orientation comprising:
            said first canopy wing and said second canopy wing;
            a first array comprising energy producing material disposed on said first canopy wing;
            a second array comprising energy producing material disposed on said second canopy wing; and
            a plurality of support columns each having a first end connected to a ground surface and extending substantially vertically along a central axis from said first end to a second end, wherein said plurality of support columns are arranged along a longitudinal axis, and wherein the plurality of support columns is positioned in a first plane;
            a plurality of support beams, each of said plurality of support beams having a support beam end and an opposing support beam end, each of said plurality of support beams coupled to said second end of one of said plurality of support columns, wherein each support beam is positioned to provide support for one of said first canopy wing at a first angle formed between one of the plurality of support beams and one of the plurality of support columns and said second canopy wing at a second angle formed between one of the plurality of support beams and one of the plurality of support columns and wherein said opposing support beam ends of said plurality of support beams are positioned higher from the ground surface than said support beam ends of said plurality of support beams;
            a plurality of purlins, wherein at least one of the plurality of purlins is disposed between one of the plurality of support beams and the first array creating a cavity therebetween into which precipitation on a top surface of the first array falls;
            a gap between the first array and the second array through which the precipitation on the top surface of the first array and the second array falls;
            a gutter extending substantially parallel to the longitudinal axis such that the precipitation that drains through the gap is directed toward one of the plurality of support columns; and
            a downspout supported by one of the plurality of support columns toward which the gutter directs the precipitation away from the dual-incline structure;
        wherein said first array is positioned in a second plane with respect to the first plane along the longitudinal axis and wherein said first array is positioned at the first angle defined by said plurality of support beams, and wherein the second array is positioned in a third plane with respect to the first plane and wherein said second array is positioned at the second angle defined by said plurality of support beams, the third plane is different than the second plane, the second and third planes intersecting at the longitudinal axis, the second angle is different than and not the supplement of the first angle; and
        wherein said first array is fixed in position such that said first array is non-adjustable upon installation and wherein said second array is fixed in position such that said second array is non-adjustable upon installation.

13. The solar power generation assembly of claim 1, further comprising:
    at least one space between the energy producing material in the first array or the second array; and
    an interstitial gasket positioned in one of the at least one space, wherein the interstitial gasket prevents the precipitation that falls on a surface of the energy producing materials in the first array or the second array from falling into the at least one space.

14. A solar power generation assembly comprising:
    a first array comprising energy producing material and a second array comprising energy producing material; and
    a first support column, a second support column, a first support beam, a second support beam, a third support beam, and a fourth support beam, wherein:
    the first support column and the second support column each comprising (i) a first end that is coupled to a ground surface, (ii) a first length that extends substantially vertically from the ground surface, and (iii) a second opposing end, the first and second support columns positioned in a first plane;
    the first support beam, the second support beam, the third support beam, and the fourth support beam each comprising (i) a support beam end and (ii) an opposing support beam end;
    the support beam end of the first support beam is coupled to the second opposing end of the first support column, the first support beam is positioned at a first angle formed between the first support beam and the first support column;
    the support beam end of the second support beam is coupled to the second opposing end of the second support column, the second support beam is positioned at the first angle formed between the second support beam and the second support column;
    the first array is positioned on the first support beam and the second support beam, the first array is positioned in a second plane with respect to the first plane forming a longitudinal axis and at the first angle defined by the first support beam and the second support beam, and the first array is fixed in position such that the first array is non-adjustable upon installation;

the support beam end of the third support beam is coupled to the second opposing end of the first support column, the third support beam is positioned at a second angle formed between the third support beam and the first support column;

the support beam end of the fourth support beam is coupled to the second opposing end of the second support column, the fourth support beam is positioned at the second angle formed between the fourth support beam and the second support column;

the opposing support beam ends of the third and fourth support beams positioned higher from the ground surface than the support beam ends of the third and fourth support beams;

the second array is positioned on the third support beam and the fourth support beam, the second array is positioned in a third plane with respect to the first plane, the third plane is different than the second plane, the second and third planes intersecting at the longitudinal axis, the second array is positioned at the second angle defined by the third support beam and the fourth support beam, and the second array of solar modules is fixed in position such that the second array of solar modules is non-adjustable upon installation;

the second angle is greater than 90 degrees; and the first angle is not the supplement of the second angle.

15. The solar power generation assembly of claim 14, further comprising a first purlin and a second purlin, wherein the first purlin is coupled to the first support beam and the second support beam to support the first array and wherein the second purlin is coupled to the third support beam and the fourth support beam to support the second array.

16. The solar power generation assembly of claim 14, further comprising a membrane mounted beneath the first array or the second array, wherein the first array or the second array comprises a plurality of spaces between the the energy producing material of the first array or the second array through which precipitation falls from a surface of the energy producing material in the first array or the second array and on to the membrane.

17. The solar power generation assembly of claim 14, further comprising a gap between the first array and the second array through which precipitation on a top surface of the first array or the second array falls.

18. The solar power generation assembly of claim 17, further comprising a gutter that directs the precipitation toward one of the first support column and the second support column.

19. The solar power generation assembly of claim 14, further comprising:
  at least one space between the energy producing material in the first array or the second array; and
  an interstitial gasket positioned in the at least one space, wherein the interstitial gasket prevents precipitation that falls on a surface of the energy producing material in the first array or the second array from falling into the at least one space.

* * * * *